(12) United States Patent
Riho

(10) Patent No.: US 9,640,240 B2
(45) Date of Patent: May 2, 2017

(54) PARTIAL ACCESS MODE FOR DYNAMIC RANDOM ACCESS MEMORY

(71) Applicant: Micron Technology, Inc., Boise, ID (US)

(72) Inventor: Yoshiro Riho, Nagoya (JP)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 14/168,899

(22) Filed: Jan. 30, 2014

(65) Prior Publication Data
US 2015/0149717 A1    May 28, 2015

Related U.S. Application Data

(60) Provisional application No. 61/909,097, filed on Nov. 26, 2013.

(51) Int. Cl.
*G06F 12/00* (2006.01)
*G11C 11/406* (2006.01)

(52) U.S. Cl.
CPC .. *G11C 11/40615* (2013.01); *G11C 11/40622* (2013.01)

(58) Field of Classification Search
CPC ............... G11C 11/40615; G11C 11/40622
See application file for complete search history.

(56) References Cited

U.S. PATENT DOCUMENTS

| 5,845,059 A | * | 12/1998 | McClure | ............... G11C 29/36 714/27 |
|---|---|---|---|---|
| 2005/0169083 A1 | | 8/2005 | Riho et al. | |
| 2005/0219890 A1 | | 10/2005 | Riho et al. | |
| 2005/0229076 A1 | | 10/2005 | Riho et al. | |
| 2006/0087903 A1 | * | 4/2006 | Riho et al. | .................... 365/222 |
| 2008/0212386 A1 | | 9/2008 | Riho | |

FOREIGN PATENT DOCUMENTS

JP    2006-120251    5/2006

OTHER PUBLICATIONS

Riho, et al., "A new DRAM architecture and its control method for the system power consumption", GLSVLSI '14 Proceedings of the 24th edition of the great lakes symposium on VLSI, May 20, 2014, pp. 187-192.

* cited by examiner

*Primary Examiner* — Kalpit Parikh
(74) *Attorney, Agent, or Firm* — Dorsey & Whitney LLP

(57) ABSTRACT

Some embodiments provide a method to reduce the refresh power consumption by effectively extending the memory cell retention time. Conversion from 1 cell/bit to $2^N$ cells/bit reduces the variation in the retention time among memory cells. Although active power increases by a factor of $2^N$, the refresh time increases by more than $2^N$ as a consequence of the fact that the majority decision does better than averaging for the tail distribution of retention time. The conversion can be realized very simply from the structure of the DRAM array circuit, and it reduces the frequency of disturbance and power consumption by two orders of magnitude. On the basis of this conversion method, some embodiments provide a partial access mode to reduce power consumption dynamically when the full memory capacity is not required.

16 Claims, 22 Drawing Sheets

| Total capacity | 256-Mb | 1-Gb | 2-Gb |
|---|---|---|---|
| BANK structure | 4BANKs | 8BANKs | 8BANKs |
| BL length | 512 | 512 | 512 |
| WL length | 512 | 512 | 512 |
| AREF | 8-K | 8-K | 8-K |
| X address | X0-X12 | X0-X13 | X0-X14 |
| Y address | Y0-Y9 | Y0-Y9 | Y0-Y9 |
| Data | X8 | X8 | X8 |
| Page size | 8K | 8K | 8K |
| $t_{ref}$ | 64ms | 64ms | 64ms |
| VDD | 2.5V | 1.5V | 1.5V |

| RAM (64M partial access) | | |
|---|---|---|
| flow | tREF | Current consumption |
| Partial Access and self refresh entry<br>↓ 2s<br>Self refresh exit<br>↓ partial access<br>Self refresh entry<br>↓ 2s<br>Self refresh exit<br>↓ partial access<br>Self refresh entry<br>↓<br><br>repeat<br><br>↓<br>Self refresh exit<br>↓ partial access<br>Self refresh entry<br>↓ 2s<br>Self refresh and partial access exit | 6.0s<br><br>512ms<br><br>6.0s<br><br>512ms<br><br><br><br><br><br><br><br>6.0s | 61.4uA<br><br><br><br>61.4uA<br><br><br><br><br><br><br><br><br><br>61.4uA |

FIGURE 6C

| Access unit | tREF | REF current | DC current | Standby Current |
|---|---|---|---|---|
| 512M (full) | 0.15s | 458uA | 60uA | 518uA |
| 128M | 0.30s | 114uA | 60uA | 174uA |
| 64M | 2.0s | 8.6uA | 60uA | 68.6uA |
| 32M | 6.0s | 1.4uA | 60uA | 61.4uA |
| 16M | 13.0s | 0.5uA or less | 60uA | 60uA |

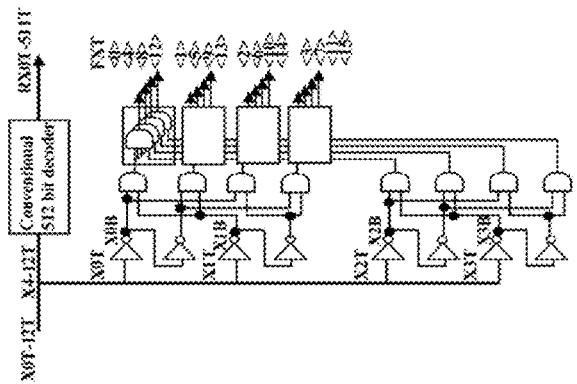
FIGURE 8A
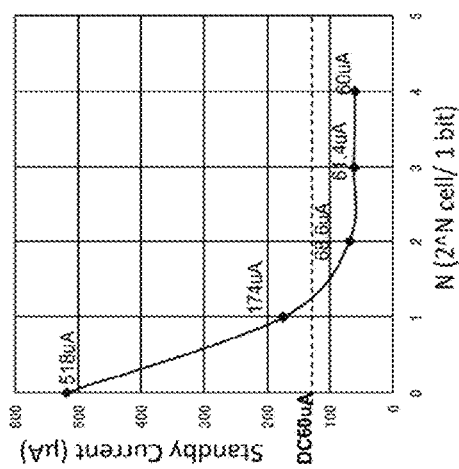
FIGURE 6G
| Bits2-0 | Access Array | $t_{ref}$ | times | $t_{REF}$ |
|---|---|---|---|---|
| | 000 | 256M(All Banks) | 64ms | 8Kref | 7.8μs |
| | 001 | 128M(X0=0) | 128ms | 4Kref | 31.3μs |
| | 010 | 64M(X0=X1=0) | 256ms | 2Kref | 125μs |
| | 011 | restriction | --- | --- | --- |
| PAM | 100 | restriction | --- | --- | --- |
| | 101 | 32M(X0=X1=X2=0) | 512ms | 1Kref | 500μs |
| | 110 | 16M(X0=X1=X2=X3=0) | 1024ms | 512ref | 2000μs |
| | 111 | restriction | --- | --- | --- |
FIGURE 7

PAM X-decoder: waveform (N2=H)

PARTIAL ACCESS MODE FOR DYNAMIC RANDOM ACCESS MEMORY

CROSS-REFERENCE TO RELATED PATENT APPLICATIONS

This application claims priority to U.S. Provisional Patent Application 61/909,097, filed 26 Nov. 2013, which is incorporated herein by reference in its entirety.

BACKGROUND

The present invention relates generally to dynamic random access memory (DRAM). Demands have been placed on DRAM to not only have increased memory capacity and data transfer speed, but also reduced operating and standby currents. When a system uses a DRAM, a refresh operation is necessary because of its data retention time restriction; each bit of the DRAM is stored as an amount of electrical charge in a storage capacitor that is discharged by the leakage current. Power consumption for the refresh operation increases in proportion to the memory capacity.

Japanese Patent application JP 2006-120251 provides a semiconductor memory self-refresh control method which can extend a refreshing cycle and significantly reduce the current consumption of a DRAM when a self-refresh operation is carried out. In that reference, a storage area, which is a memory cell (MC) group on the prescribed number of word lines (SWL) which are data storage objects of the whole memory arrays, is set independently of a copying area which is a memory cell group on the word lines, which are the copying destinations of all the data in the storage area. Prior to the execution of a self-refresh operation, a bit information-copying operation to one memory cell or to each of the memory cells in the copying area in the same bit line (BL) or in the same bit pair lines is executed in terms of each memory cell in the storage area as the copying source. Then, line addresses are sequentially designated in terms of the storage area as the refreshing object, and the corresponding word lines are selected and driven, and, at the same time, one or more word lines of the corresponding copying area are selected and driven to execute the self-refresh operation.

SUMMARY OF THE INVENTION

Certain aspects of embodiments disclosed herein by way of example are summarized below. It should be understood that these aspects are presented merely to provide the reader with a brief summary of certain forms an invention disclosed and/or claimed herein might take and that these aspects are not intended to limit the scope of any invention disclosed and/or claimed herein. Indeed, any invention disclosed and/or claimed herein may encompass a variety of aspects that may not be set forth below.

In some embodiments, a memory device is provided. The memory device includes a plurality of memory banks. The memory device further includes a controller controlling storage of data in cells of the plurality of memory banks. The memory device is provided so that the controller copies each bit of data stored in the plurality of memory banks that is to be preserved from 1 cell per bit to $2^N$ cells per bit, where N is a natural number.

In some embodiments, the memory device is provided so that the controller copying causes the effective retention time of each bit of data copied to be extended.

In some embodiments, the memory device is provided so that the effective retention time of each bit of data copied is extended by a factor of $2^N$.

In some embodiments, the memory device is provided so that the controller copying causes the power consumption of the memory device to be reduced.

In some embodiments, the memory device is provided so that the controller can reduce the power consumption of the memory device by copying each bit of data stored in the plurality of memory banks that is to be preserved from 1 cell per bit to $2^N$ cells per bit in both a normal operation mode and a self refresh operation mode.

In some embodiments, the memory device is provided so that N=4.

In some embodiments, the memory device is provided so that a portion of each memory bank of the plurality of memory banks is active when the memory device is in a self refresh mode of operation.

In some embodiments, a method for managing storage of data in a memory device is provided. The method includes storing at least one bit of data in at least one cell of the memory device, wherein each bit of data is stored in a single cell of the memory device. The method also includes copying a portion of the at least one bit of data into $2^N$ cells of the memory device.

In some embodiments, the method is provided so that the step of copying causes the effective retention time of each bit of data copied to be extended.

In some embodiments, the method is provided so that wherein the effective retention time of each bit of data copied is extended by a factor of $2^N$.

In some embodiments, the method is provided so that the step of copying allows the power consumption of the memory device to be reduced.

In some embodiments, the method is provided so that the power consumption of the memory device can be reduced by the step of copying in both a normal operation mode and a self refresh operation mode.

In some embodiments, the method is provided so that N=4.

In some embodiments, the method is provided so that the at least one cell of the memory device is spread across a plurality of memory banks of the memory device, and a portion of each memory bank of the plurality of memory banks is active when the memory device is in a self refresh mode of operation.

BRIEF DESCRIPTION OF THE DRAWINGS

These and other features, aspects, and advantages of the present invention will become better understood when the following detailed description of certain exemplary embodiments is read with reference to the accompanying drawings in which like characters represent like parts throughout the drawings, wherein:

FIG. 6C shows a diagram of RAM activity in accordance with some embodiments of the present disclosure.

FIG. 6G shows a relationship between a standby current and storage capacity of the data holding area in accordance with some embodiments of the present disclosure.

FIG. 7 shows a partial access specification in accordance with some embodiments of the present disclosure.

FIG. 8A shows a conventional X-decoder in accordance with some embodiments of the present disclosure.

DETAILED DESCRIPTION

Figures 1, 2A:
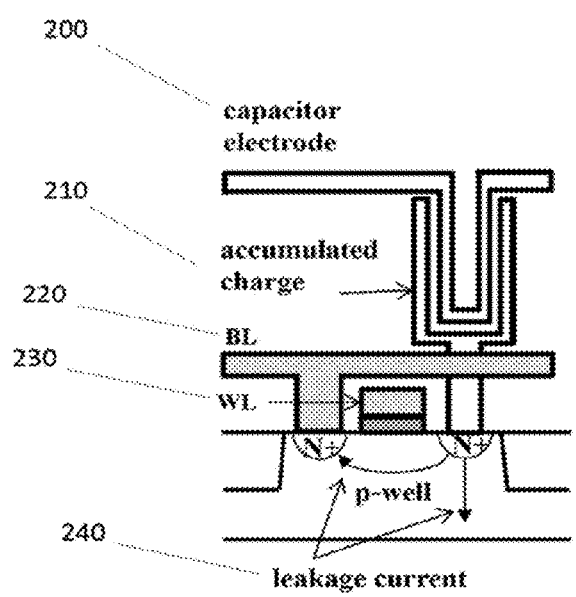
FIG. 1 is a DRAM comparison table in accordance with some embodiments of the present disclosure.
FIG. 2A shows a schematic cross section of a memory cell in accordance with some embodiments of the present disclosure.

One or more specific embodiments of the present invention will be described below. These described embodiments are only exemplary of the present invention. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Some embodiments provide a method to reduce the refresh power consumption by effectively extending the memory cell retention time. Conversion from 1 cell/bit to $2^N$ cells/bit reduces the variation in the retention time among memory cells. Although active power increases by a factor of $2^N$, the refresh time increases by more than $2^N$ as a consequence of the fact that the majority decision does better than averaging for the tail distribution of retention time. The conversion can be realized very simply from the structure of the DRAM array circuit, and it reduces the frequency of disturbance and power consumption by two orders of magnitude. On the basis of this conversion method, some embodiments provide a partial access mode to reduce power consumption dynamically when the full memory capacity is not required.

DRAM has served as the main role of storage in computer systems including high performance systems, personal computers, and mobile phones for more than 30 years. The memory capacity of a DRAM has increased to meet system demands, supported by the development of a semiconductor process technology that follows Moore's law, whereby the number of elements on a fixed silicon die doubles every 18 months. In fact, needs from the system side have included not only memory capacity but also data transfer speed, operation current reduction, and standby current reduction.

In a DRAM, each bit is stored as an amount of electrical charge in a storage capacitor, and the increase in memory capacity has directly caused two problems: disturbance and power consumption. Both of these problems are attributed to the rewrite operation to a memory cell associated with a finite data retention time.

In particular, standby power consumption has become one of the most serious problems for using a DRAM in mobile applications. Following the constant-electric-field scaling theory, the voltage should be lowered at the same rate by which the dimensions are reduced. However, the rewrite voltage is saturated by the difficulty associated with the real operation. This means that the standby power increases with the memory capacity.

In some embodiments, a method is provided to reduce the refresh current in a DRAM by extending the retention time effectively when the amount of the data to be stored is small. This low-power mode may be referred to as the partial access mode (PAM). The retention time has been shown to exhibit both tail and main distributions. Most of the cells belong to the main distribution and have retention times significantly higher than the product specification. Only a minor portion suffers from increased leakage. The short retention time with an extremely low probability (approximately 5σ from the median for the retention tail) determines the refresh interval of the memory cell. Conversion from 1 cell/bit to $2^N$ cells/bit reduces the variation in the retention time among memory cells. Although the active power increases by a factor of $2^N$, the refresh time increases by more than $2^N$ as a consequence of the fact that the majority decision does better than averaging for the tail distribution of retention time. The conversion can be realized very simply from the structure of the DRAM array circuit. This method can reduce the frequency of the disturbance and its power consumption by two orders of magnitude.

A DRAM article of manufacture according to some embodiments is fully compatible with a conventional DRAM. In its usual operating mode, the full memory capacity is used. In the PAM, the capacity is limited to $2^N$ of the total capacity. However, memory cells are fully used to share the storage charge to extend the retention time.

DRAM Operation and Power-Reduction Mode: DRAM Refresh Operation

DRAM memory capacity has been increasing, even though its die size has almost remained constant, as summarized in FIG. 1. In 2011, a 2-Gb DRAM was fabricated by a 30-nm [minimum feature size (F) value] process and was placed on the market. A DRAM stores a single bit in a memory cell as an amount of electrical charge on a storage capacitor. Charge is lost by the current of the p-n junction, sub-threshold current, and gate-induced drain (GIDL). FIG. 2A shows a schematic of a DRAM cell with a leakage current. The DRAM cell has a capacitor electrode 200, an accumulated charge 210, a bit line 220, a word line 230, and a leakage current 240. The loss of charge means that a DRAM requires a rewrite operation before the memory cell loses its storage charge. This rewrite operation is called refresh. Refresh is performed by issuing an auto-refresh command (AREF). Because refresh is a type of disturbance in the system where sense amplifier (SA) activation, pre-charging, and read or write operations are forbidden, the frequency of the AREF command should be minimized.

Figure 2B:
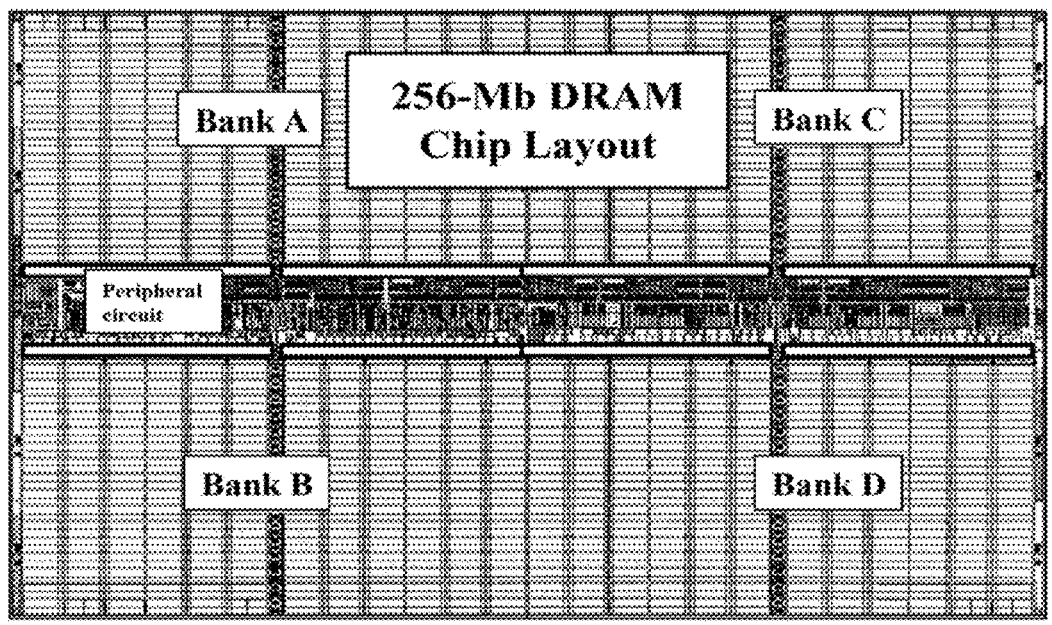
FIG. 2B shows a DRAM chip layout in accordance with some embodiments of the present disclosure.

In this disclosure, reference will generally be made to a refresh operation using a 256-Mb DRAM as an example. However, the present disclosure is relevant to any other DRAM capacity as would be understood by those of ordinary skill in the art. An example of a 256-Mb DRAM with 4 banks is shown in FIG. 2B. The refreshing of all memory cells is completed by issuing $2^{13}$=8,192 AREF commands, called an 8-K AREF operation. The data retention time of each memory cell is expressed by $t_{ret}$. The minimum retention time of the memory cells, during which all memory cells maintain their own charges, should be longer than 64 ms, standardized by the cell refresh time tref. Thus, the maximum time interval of an AREF command, tREF, is 64 ms/213=7.8 μs in an 8-K AREF operation.

The 256-Mb DRAM in FIG. 1 consists of four banks, each of which is composed of 16×16 mats. One mat is 256 Kb, including 512 wordlines (WLs) and 512 bitlines (BLs), as shown in FIG. 2A. In an 8-K AREF operation, a single AREF command is accomplished by one refresh operation for all four banks. In each bank, one refresh operation is applied to 16 mats located in the WL direction. The corresponding 16 WLs are selected at the same time, and memory node voltages are read to the BLs through transfer NMOS-FETs. These signals are amplified by sense amplifiers that perform rewrite operations of 8-K memory cells. Once an SA is activated, 16 WLs allocated on the same X address of the 16 mats in one bank are selected at once, and data are read to 8-K BLs. This number, 8-K, is called the "page size" and shows the maximum data size written or read during one SA activation. If the data size for writing is greater than this page size, the system must issue a pre-charge command and another activate command.

Figure 2C:
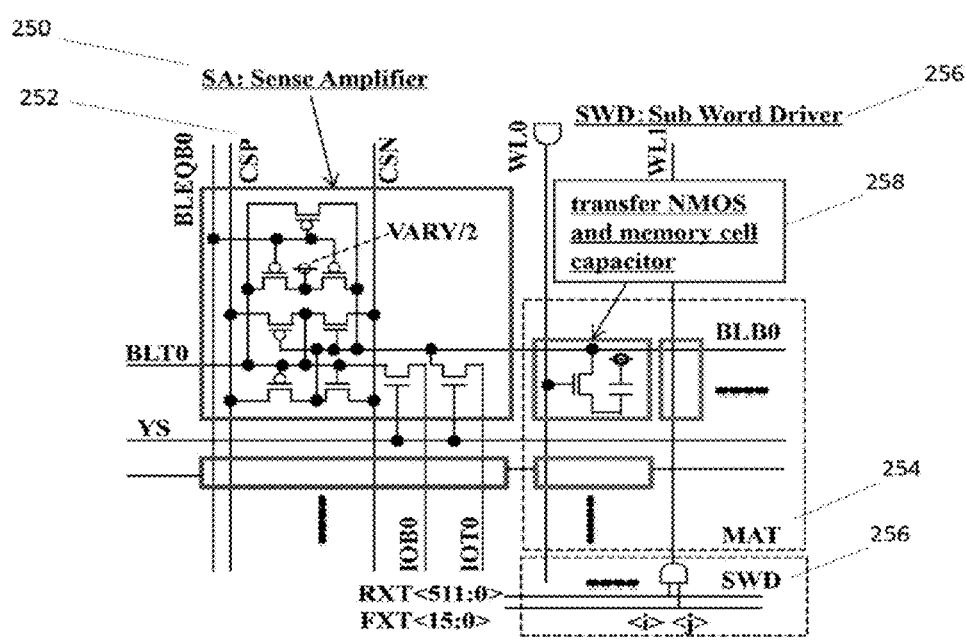
FIG. 2C shows an array circuit in accordance with some embodiments of the present disclosure.
Figure 2D:
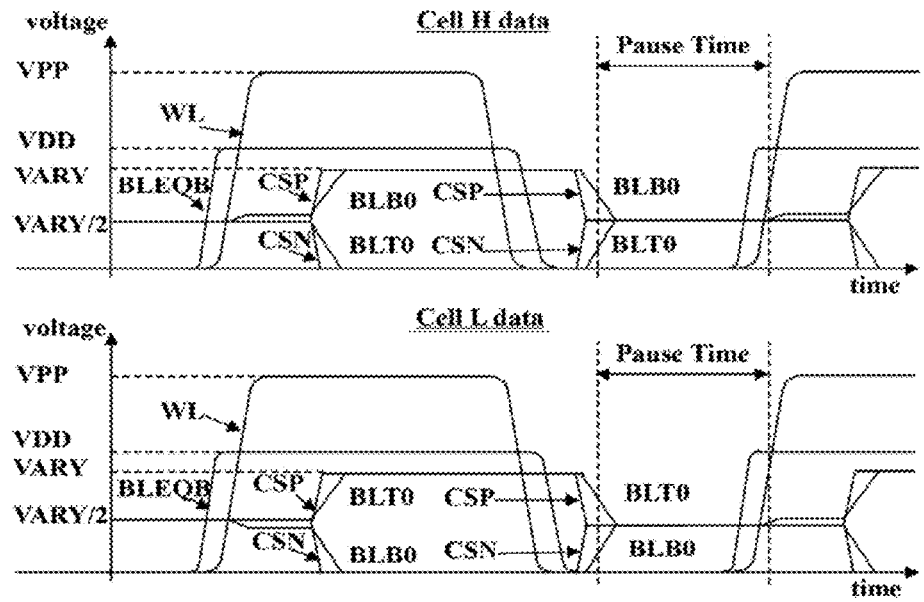
FIG. 2D shows an array circuit waveform in accordance with some embodiments of the present disclosure.

FIG. 2C shows an array circuit in accordance with some embodiments of the present disclosure. The array circuit includes a sense amplifier 250, common power supply 252, mat 254, sub word driver 256, transfer NMOS and memory cell capacitor 258, and other elements there illustrated. As shown in the figure, each sense amplifier SA 250 located next to the mat 254 has common power supplies CSP 252 for a PMOSFET and CSN for an NMOSFET; these perform pre-charging and SA amplification, as illustrated in FIG. 2D. In the pre-charge mode, CSP, CSN, and the BL (BLT and BLB) voltages are set to VARY/2, which is half of the voltage of VARY. The high (H) and low (L) levels of the BL voltage are VARY and VSS (0 V), respectively. First, the SA amplification voltage VDD is applied to BLEQB, which reduces BLT/B from VARY/2. Then, the selection of the WL connects the memory node to the BL. The charge in the storage capacitor changes the BL voltage to a higher or lower value than VARY/2. The difference from VARY/2 is called the "signal amount." After the voltage of the BL has stabilized, CSP is changed to VARY, and CSN is changed to VSS at the same time. The SA increases the voltage difference between BLT and BLB to VARY. In the pre-charge mode, the WL voltage is changed to VSS to reduce the memory node from the BL voltage, and then, CSP and CSN are reduced from VARY and VSS, respectively. Finally, BLEQB is lowered to set CSP, CSN, and the BL voltage to VARY/2. The WLs are driven by a sub word driver, which receives RXT signals and FXT signals. The RXT signals and FXT signals can be produced from X address signals. The RXT signals and the FXT signals can be called main word lines and word line driving signals respectively.

DRAM Operation and Power-Reduction Mode: Charge Retention Time

Figure 3A:
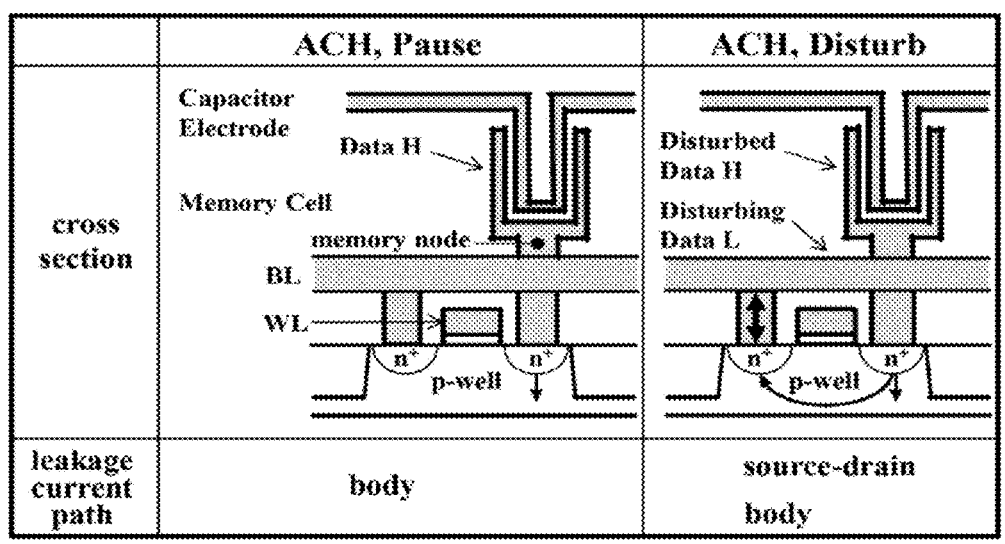
FIG. 3A shows a memory cell structure and leakage current path in accordance with some embodiments of the present disclosure.

The AREF interval time, $t_{REF}$, should be as long as possible to meet the system requirements. For example, a user may set this time to 7.8 μs, which is the maximum value defined from the specification, $t_{ref}$ of 64 ms. The retention time $t_{ret}$ depends on the characteristics of a memory cell that has a leakage current that reduces the charge on the storage capacitor. This leakage current is caused by the diffusion and generation of electrons and holes at the p-n junction in the silicon substrate, the sub-threshold current, and GIDL. FIG. 3A shows the structure of the storage capacitor and transfer NMOSFET in a memory cell. The leakage current is influenced by the voltages of the WL, BL, and body (p-well). This causes a variety of $t_{ret}$ values among several conditions. There are two states that hold the storage charge in the memory cell, described as follows.

State 1: the observed memory cell is not selected, and all memory cells in the same mat are not selected. WL voltage=VSS, and BL voltage=VARY/2. If the memory node voltage is H in the observed memory cell, leakage current flows from the memory node to the body. The left panel in FIG. 3A shows this state. The memory node voltage H is changed to L in $t_{ret}$, which is the specific finite time of the cell. This destruction mode can be referred to as the all cell high (ACH) pause. "All" in ACH means that the memory node voltages in all DRAM memory cells are H at the last restore time. If the memory node voltage is L, there is no destruction to H, as the voltage of the body is the same voltage, L.

State 2: the observed memory cell is not selected, and one of the other WLs in the same mat is selected. WL voltage=VSS, and BL voltage=H or L. If the memory node voltage is H and BL voltage is L, leakage current flows not only into the body but also into the BL. The electric field induces a current into the BL. This destruction mode can be referred to as ACH disturb. If the memory node voltage is L and BL voltage is H, only leakage current into the BL appears, and there is no current into the body. This can be referred to as all cell low (ACL) disturb. The case of ACH disturb is the worst, because there are two current paths. The right panel in FIG. 3A shows this state.

Figure 3B:
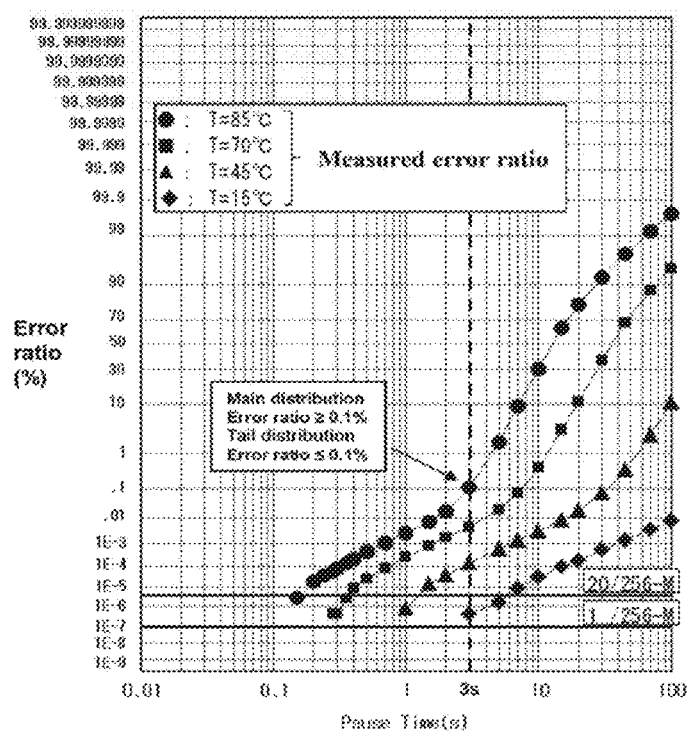
FIG. 3B shows a chart of measured error ratio with temperature dependency in accordance with some embodiments of the present disclosure.

The measured $t_{ret}$ data in state 1 is obtained from the time when the fail-bit judgment of the read command appears after a pause time in the pre-charge mode from the write operation of memory node voltage H. FIG. 3B shows a chart of measured error ratio with temperature dependency in accordance with some embodiments of the present disclosure. FIG. 3B expresses the pause time. For a 256-Mb DRAM, the fail-bit count of ACH pause denotes the number of cells of signal L in 256 Mb after the write operation of H. In FIG. 3B, 1 cell/bit measurement data show the error ratio of the 256-Mb DRAM from 100 ms to 100 s, where the error ratio is defined by the number of fail bits divided by 256 Mb. The error ratio is converted with an inverse cumulative distribution function to check whether the distribution coincides with a standard normal distribution. If the distribution appears as a standard normal distribution, the line becomes straight. FIG. 3B shows that all lines have a kink, indicating the existence of two kinds of standard normal distributions, tail and main distributions. The variation of $t_{ret}$ is greater than three orders of magnitude at a temperature of 85° C., and $t_{ret}$ has one order of variation in the area whose error ratio is less than 0.1%. This means that, although $t_{ret}$ of 99.9% for 256 Mb is longer than 3 s, $t_{ret,min}$ of the 256-Mb DRAM is 100 ms. This difference is caused by the tail distribution, whose error ratio is less than 0.1%. Furthermore, the variation among temperatures is very large. According to FIG. 3B, $t_{ret,min}$ of 100 ms at a temperature of 85° C., which is the worst value, is improved to 1 s at 45° C. In the DRAM specification, $t_{ref}$ ensures a $t_{ret,min}$ of 64 ms at temperatures between 0° C. and 85° C. A DRAM supplier can replace the worst 20 or 30 memory cells with other good ones prepared in advance. FIG. 3B shows the effect of 20-bits replacement.

Figure 3C:
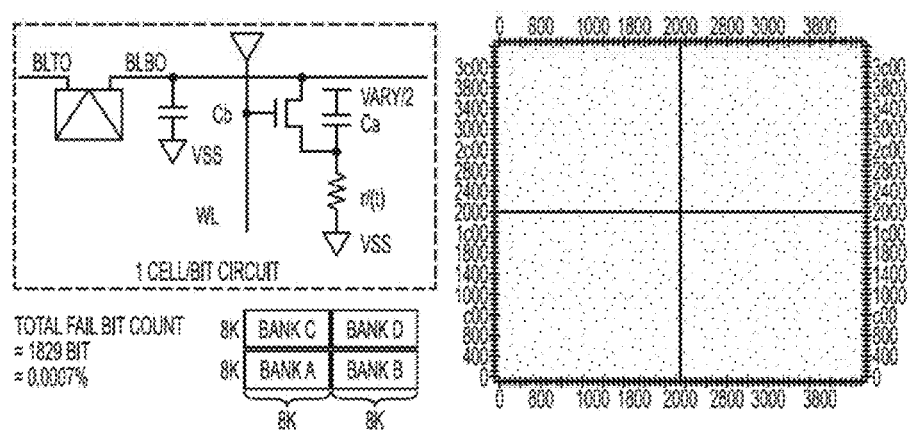
FIG. 3C shows a fail bit map in accordance with some embodiments of the present disclosure.
Figures 3D, 4A:
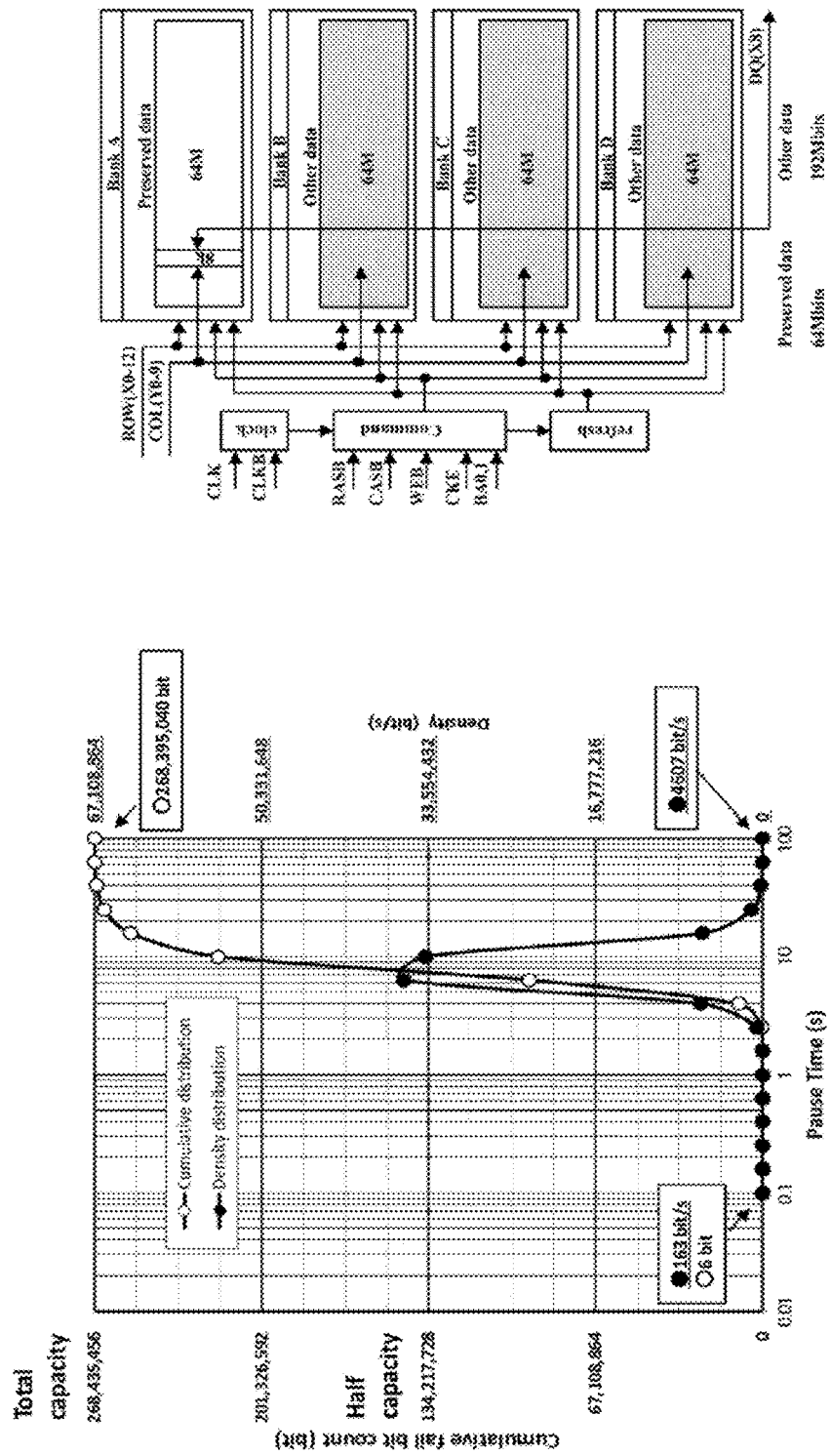
FIG. 3D shows a chart of cumulative fail bit count and the density distribution in accordance with some embodiments of the present disclosure.
FIG. 4A shows a 1-Bank PASR configuration in accordance with some embodiments of the present disclosure.

FIG. 3C shows a fail bit map of 256-Mb DRAM in each pause time after H write operation to all memory cells at 85° C., which may represent the worst condition for the leakage current in DRAM specifications. Cumulative distribution in FIG. 3D shows the fail bit counts of 256-Mb DRAM in each pause time after H write operation to all memory cells at 85° C. Fail bit appears at pause time=100 ms, but error ratio (=fail bit count/total capacity) begins to increase at pause time=4 s, which is 40 times larger than $t_{ret,min}$. Density distribution in FIG. 3D is defined from the difference of fail bit counts and of pause time (ΔCumulative distribution/Δpause time), which clarifies the distribution feature. The variation of $t_{ret}$ is larger than 3 orders and the average value of $t_{ret}$ is around 10 s. This indicates that the $t_{ret,min}$ of 256-Mb DRAM is 100 ms although $t_{ret}$s of almost all memory cells in 256-Mb is longer than 4 s. This is caused by the $t_{ret}$ variation among memory cells.

DRAM Operation and Power-Reduction Mode: DRAM Standby Current

A DRAM consumes standby power, mainly by refresh, even when there are no read and write accesses to memory cells. The storage capacitor needs around 20 fF, independent of F, as tref is always 64 ms through all generations. If the minimum feature size is cut in half by process improvement, the memory capacity of the DRAM for the same die size increases by a factor of four. The voltage to rewrite data should be lowered to maintain the same power consumption. However, the BL rewrite voltage VARY saturates at around 1 V caused by real operation difficulties. FIG. 1 shows the external voltage saturation which is caused by SA amplification where VARY is the source voltage. Therefore the amount of refresh current increases by a factor of four as well. In fact, the total refresh current is less than this, because the other currents used to drive signals for the refresh operation become less than half owing to the miniaturization. Taking this factor into account, the standby power increases in every generation.

If there is no access to the DRAM, $t_{ret}$ is determined only by ACH pause (1) without disturb (2) discussed previously. The DRAM has a SELF mode in the specification, which means that the DRAM performs a refresh operation by itself in the longer interval $t_{ref,ctl}$. The oscillator circuit in the DRAM can adjust the period for $t_{REF}$ in the SELF mode. This adjustment based on the measurement of the manufactured DRAM enables a greater reduction in power consumption in the SELF mode. This $t_{REF}$ adjustment is set on the basis of the $t_{ret}$-measured DRAM data that were compiled during the manufacturing process of the silicon wafer. If it is known in advance that the system has no access to the DRAM in a certain interval, a user issues a SELF ENTRY command, which is the longest time interval during which storage charge is not lost. Once the DRAM receives a SELF ENTRY command, it remains in the SELF mode until receiving a SELF EXIT command, and it accepts no commands except SELF EXIT.

Conventional PASR Method

System side requests contradictory performance, e.g., power consumption should be reduced in spite of the increase in the memory capacity. Recent smartphones require a long battery life as well as a significant amount of memory to enable better video on a more vivid and detailed screen. Even in the standby mode, smartphones periodically check for incoming calls and utilize a certain amount of memory. The system demands much greater power reduction than when it is in the SELF mode. The conventional power reduction method is partial array self refresh: PASR, as shown here for a 256-Mb DRAM with four banks. The refresh operation is stopped for two or three of the four banks Both the memory capacity and the refresh current decrease by a factor of two or four in the SELF mode. PASR has no regulation in the normal mode and two problems from the system-side viewpoint may exist.

Figure 4B:
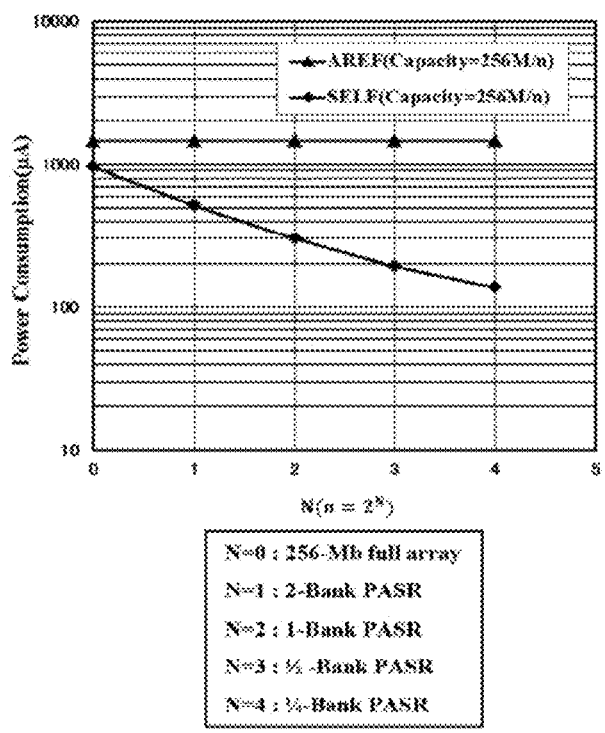
FIG. 4B shows a chart of measured current value for a 1-Bank PASR configuration in accordance with some embodiments of the present disclosure.

Problem 1: there is mismatch in the number of banks between the AREF operation in the normal mode and PASR. FIG. 4A is a block diagram that illustrates a one-bank PASR. At the first refresh after SELF EXIT, an AREF command is issued to select WLs of all four banks, although three of those do not store data. This means that power consumption is four times larger than needed, as a refresh operation for three banks is not necessary. FIG. 4B shows power consumption using PASR as given by the measured standby current of 256-Mb DRAM. The memory capacity in SELF is limited to 256-M/n where $n=2^N$. The constant power consumption in AREF is estimated from the maximum AREF interval $t_{REF}$.

Problem 2: the system usually activates the SA for all banks and accesses four pages (8-K×4=32-K size) of the four banks, because the frequency of the disturbance factor, i.e., pre-charge, should be less. However, the PASR mode cannot preserve all 32-K data in four banks, so four pages must be activated separately with four pre-charge operations before entering the SELF mode to preserve the 32-K accessed data.

Figure 4C:
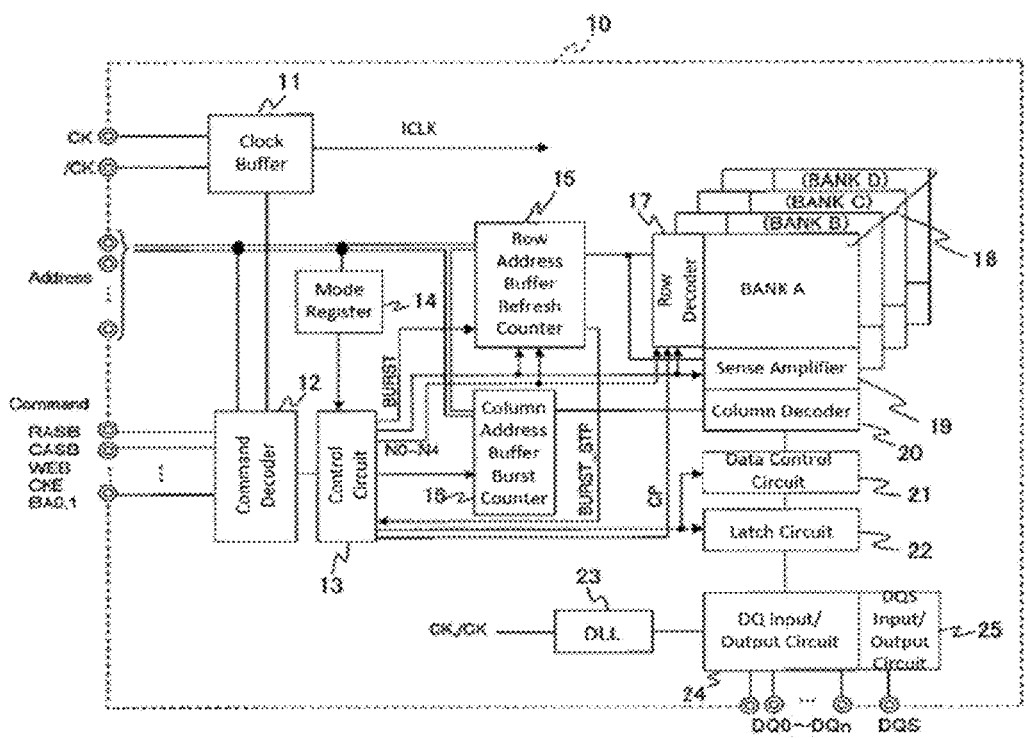
FIG. 4C shows a diagram of a semiconductor device in accordance with some embodiments of the present disclosure.

FIG. 4C illustrates an exemplary semiconductor device 10 implementing some of the features just described. The semiconductor device 10 can be called a semiconductor chip. A memory module includes a plurality of semiconductor chips like SIMM (Single Inline Memory Module), DIMM (Dual Inline Memory Module) and RIMM. The memory module can be mounted on a mother board so that the memory chip is electrically connected to a CPU including memory control function or a memory controller chip, each of which is mounted on the mother board. Control circuit 13 controls the operation of the semiconductor device 10. The control circuit 13 is provided in the device 10 and responds to read or write command input from outside of the device 10 for conducting write or read operation from or to the memory cells. The control circuit 13 controls a partial access based on the information (data set) stored in the mode register 14. The control circuit 13 generates a burst signal, selection setting signal N0-N4, a copy pulse CP and other control signals. The control circuit 13 receives a burst signal stop signal BURST STP and so on. Mode register 14 holds the data set, which is information that defines the behavior of 10 semiconductor device. Row address buffer refresh counter 15 temporarily holds the address signal inputted from the outside, based on an output from the control circuit 13, to generate an address signal for refresh operation. The row address buffer refresh counter 15 functions as an address signal generation circuit. Row decoder 17 decodes the address signal from the row address buffer refresh counter 15, and activates the word line corresponding to the decoded address signal. In other words, the row decoder 17 functions as a word line activation signal generation circuit. The row decoder 17 activates plural word lines at the same time as the access unit based on control of the control circuit 13.

Memory cell array 18 has plural banks BANK_A-D. The Banks BANK_A-D are formed on the same substrate. Each bank is divided into a plurality of blocks. Each block includes a plurality of memory cells connected to plural bit lines and plural word lines. Each of memory cells is assigned a unique address and selected by the address signal.

In order to reduce the power consumption in low power consumption mode, semiconductor devices mounted on the mobile phone performs a self refresh operation which is called a partial array self refresh (PASR). The PASR performs self refresh only for a portion of the memory cell array. For example, the PASR performs the self refresh for only one bank against a memory cell array having four banks BANK_A-D. The method allows its power consumption needed for self refresh operation to reduce ¼. The semiconductor device 10 has a partial access mode which sets a portion of each of banks A-D as accessible area (data holding area) and operates self refresh only for the set portion of each of banks A-D.

Figure 4E:
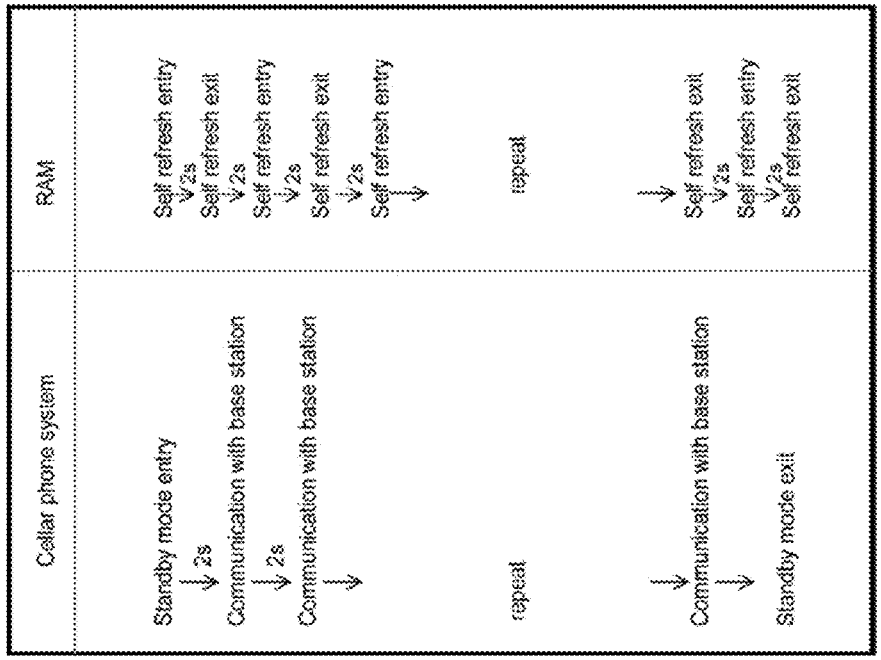
FIG. 4E shows a diagram of cell phone system and RAM activity in accordance with some embodiments of the present disclosure.
Figure 4D:
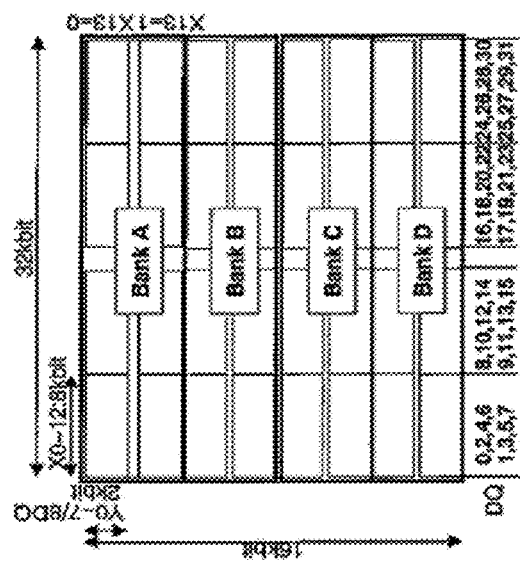
FIG. 4D shows a schematic view of a DRAM in accordance with some embodiments of the present disclosure.

FIG. 4D shows an example of a DRAM, which has 256M bit capacity and 32-bit input and output data configurations. The DRAM is capable of selecting each memory cell using Y address Y0-Y7 and X address X0-13 (mat address X0~X8, X9~X13 mat outside address). The DRAM has a page size of 8 kbit and a refresh frequency of 8 Kref.

FIG. 4E shows a cellular phone periodically communicating with the base station in standby state, that is, low power consumption mode. For example, after the entry into the low power consumption mode, the portable phone repeats transmission (communication access period 280 μs) with the base station every 2 seconds. As shown in the right column of the figure, the semiconductor device mounted in the mobile phone repeats self refresh (280 μs) every 2 seconds.

Partial Access Mode

Mismatches between the AREF operation in the normal mode and the preserved bank data in PASR have been explained. PAM eliminates these mismatches and uses all memory cells efficiently. One characteristic of the PAM is that it holds data using $2^N$ cells/bit to extend $t_{ret}$. Another characteristic is the control method between 1 cell/bit and $2^N$ cells/bit that is located higher in the hierarchy than the control of the normal and SELF modes. The PAM reduces the refresh operation frequency for both the normal and the SELF modes. As a result, the AREF command frequency in the normal mode and power consumption in the SELF mode are reduced at once. In contrast, PASR reduces the power consumption in the SELF mode only.

Figure 5A:
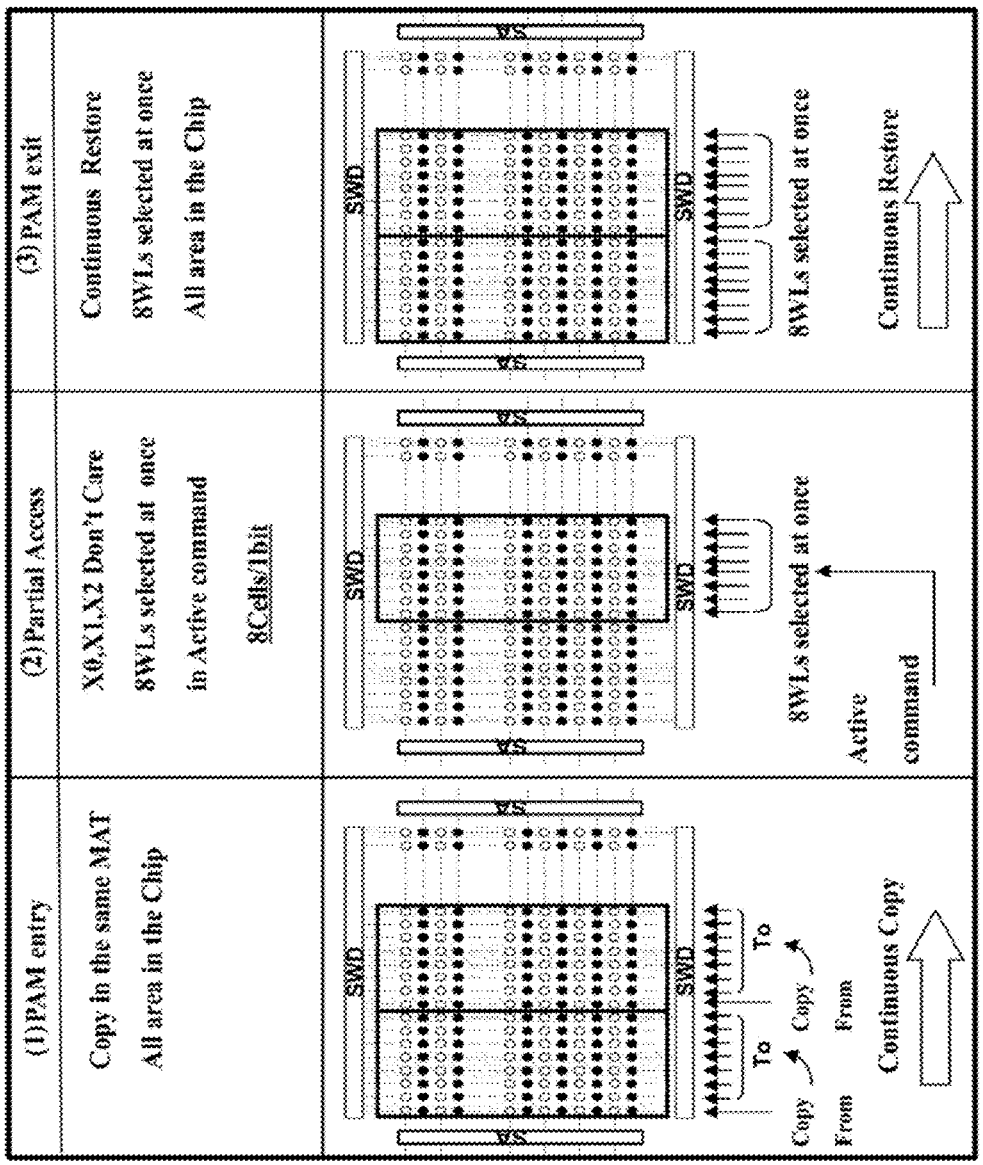
FIG. 5A shows a partial access conversion table in accordance with some embodiments of the present disclosure.
Figure 5B:
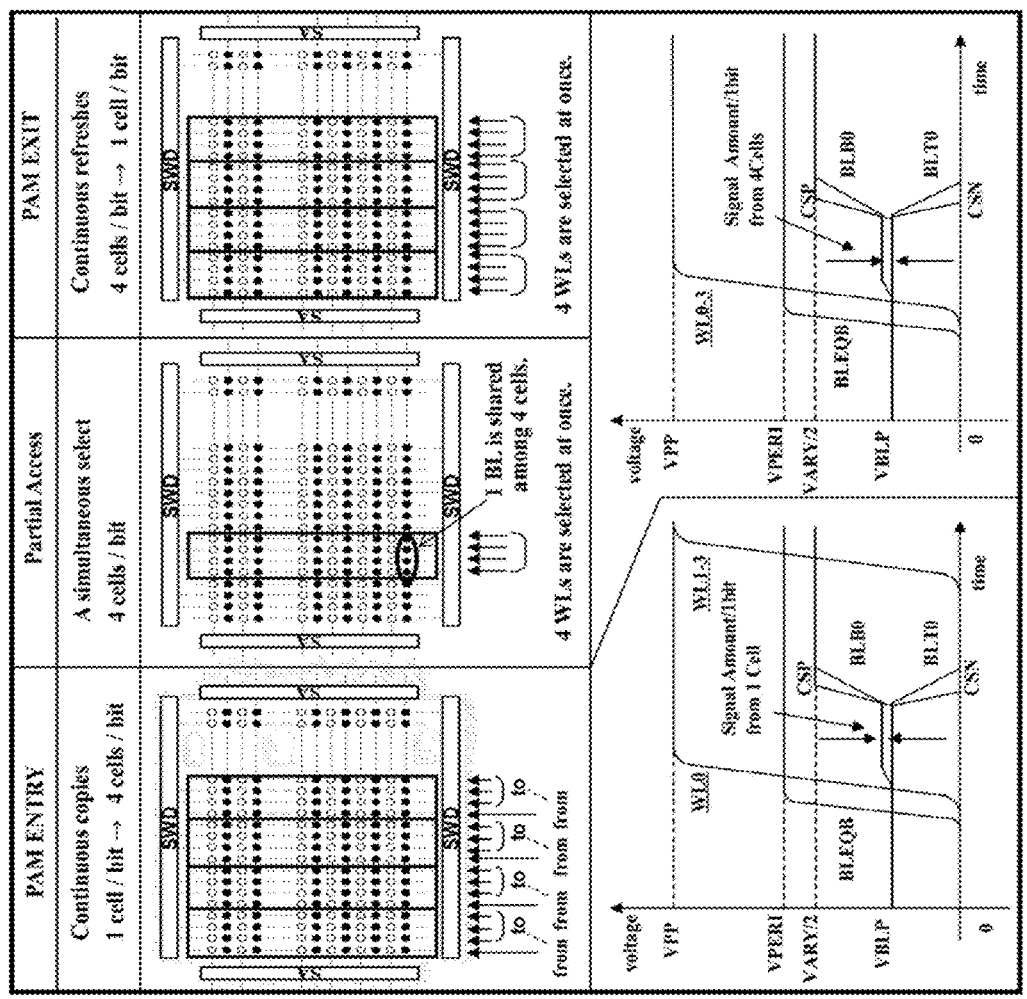
FIG. 5B shows a partial access conversion table in accordance with some embodiments of the present disclosure.

A PAM ENTRY operation indicates a conversion from 1 cell/bit to $2^N$ cells/bit. This may simply be a copy operation from the memory cell connected with one WL to $2^N-1$ memory cells connected with $2^N-1$ WLs in the same mat. FIGS. 5A and 5B shows how this operation is simply achieved by the DRAM array architecture in FIG. 2C. This operation is performed by only a delayed WL selection. A PAM ENTRY operation is completed through 8-K/$2^N$ copy operations applied to all memory cells in the 256-Mb DRAM.

In the PAM, $2^N$ memory cells compensate for each other's storage charge by selecting $2^N$ WLs at the same time in both the normal and the SELF modes, as shown in FIG. 5. This enables an extension of $t_{ret}$, which is discussed later in the present disclosure.

A PAM EXIT operation indicates a reconversion from $2^N$ cells/bit to 1 cell/bit, which is necessary because the storage charge in one memory cell is not enough to read one bit. $2^N$ times the charge in the PAM is used for one bit. A PAM EXIT operation is simply continuous 8-K/$2^N$ refresh operations to all memory cells. The array circuit in FIG. 2C illustrates this operation very simply.

One refresh operation takes 100 ns, meaning that continuous 8-K refresh operations to all 256-M memory cells take 8-K×100 ns=819.2 μs. The turn-around time for PAM ENTRY or PAM EXIT is approximately 819.2 μs/$2^N$, because the memory capacity is changed from 256-M to 256-M/$2^N$ as well. The PAM ENTRY operation can be referred to as a partial access conversion, being a continuous copy in the entire capacity, and the PAM EXIT operation can be referred to as a partial access reconversion, being a continuous refresh in the entire capacity.

Figure 6B:
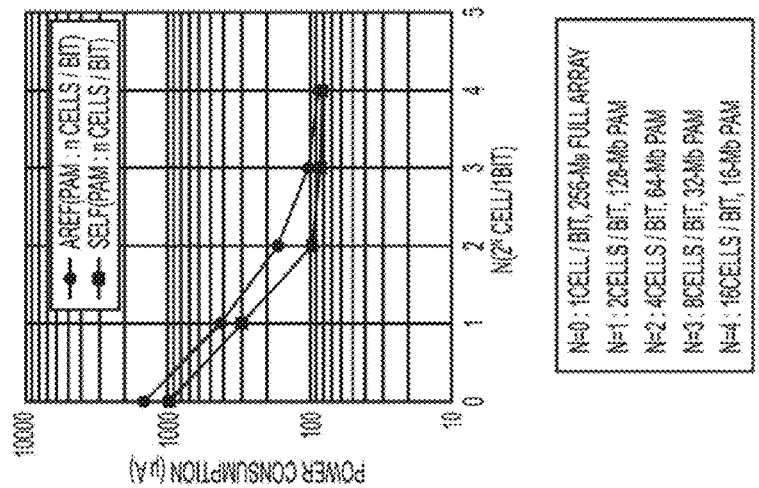
FIG. 6B shows a chart of estimated current value of a partial access configuration in accordance with some embodiments of the present disclosure.

FIG. 6B shows power consumption using PAM as given by the measured standby current of 256-Mb DRAM. The memory capacity in SELF is limited to 256-M/n where n=$2^N$. The constant power consumption in AREF is estimated from the maximum AREF interval $t_{REF}$.

Referring now to FIG. 5A, the memory cells are indicated by ○ or ●. The word lines are provided along the vertical direction in figure and are connected to an associated one sub word driver (SWD) located above and below the figure. The sub word driver constitutes a part of the row decoder 17. The bit line is provided along the lateral direction of the figure and is connected to an associated one sense amplifier (SA) 19 located at the left of figure.

When entry to the partial access mode, as shown in the left panel of FIG. 5A, semiconductor device 10 copies the data of each memory cell (source) connected to the word line of the holding region to one or plural memory cell(s) (destination) corresponding to and connected to the word line in the copy area.

This is achieved by reading out data hold by the memory cells connected to the source word line and to a corresponding bit line and amplifying the data on the bit line, and activating the word line connected to the destination memory cells (connected to the same bit line) in the same mat. The copy operation is carried out continuously until all the source data is copied to the destination memory cells. In the partial access mode, as shown in the center panel of FIG. 5A, the memory device simultaneous access to the plurality of memory cells that hold the same data. In other words, plural word lines connected to the plurality of memory cells are activated at the same time. For example, to activate at the same time eight word lines, row address X0, X1, X2 row address may be neutralized (Don't Care).

When exiting from the partial access mode, as shown in the right panel of FIG. 5C, all bank refresh is performed against all the memory cells in the chip as plural word lines as an access unit.

Figure 6A:
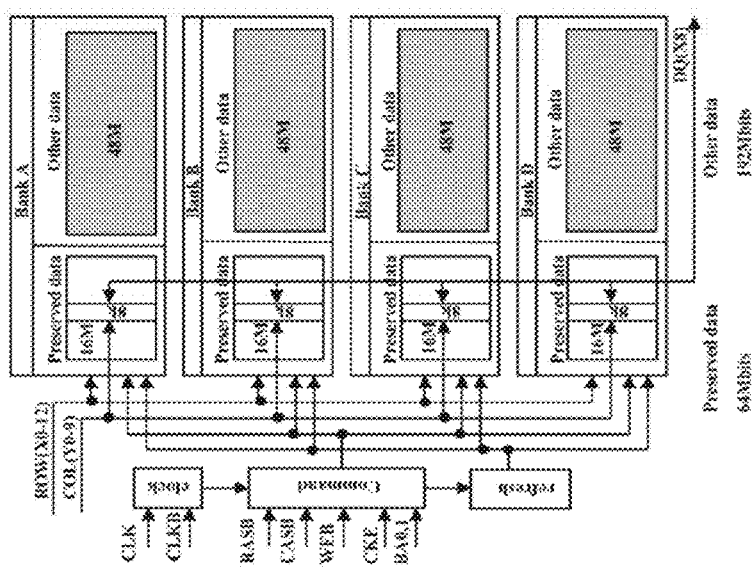
FIG. 6A shows a partial access configuration in accordance with some embodiments of the present disclosure.

Referring now to FIG. 6A, a case of setting 32M bit memory cells as data holding area in the 256M bit DRAM is illustrated. Each bank of memory cells is set 8M bit memory cells as the holding area (address space being accessed), the remaining 48 M bit memory cells as the copy area. The refresh number, needed for refreshing all memory cells one time as a refresh target, can be reduced by limiting to the accessible area by this method. As a result, not only the refresh number of self refresh but also the interrupt counts can be reduced. In the case where small data transmission only takes place as the idle mode of the mobile phone, no problem occurs even if the accessible region is limited to a portion of the memory cell array. The data holding area is set in the semiconductor device 10. Also, the copy region other than the data holding area is set in the semiconductor device 10. The memory cells in the copy region are used as memory cells independently in the normal operation mode, and used for retaining data stored in the memory cells in the holding region in the partial access mode.

That is, in the partial access mode, the same data is held by plural memory cells (for example, eight memory cells), which are connected to different word lines one another and connected to the same bit line. During the partial access mode, the plural word lines connected to the plurality of memory cells holding the same data are activated/deactivated simultaneously. In other words, during the partial access mode, the word lines or memory cells constitutes an access unit for the memory. The number of memory cells (word lines) as the access unit is $2^N$ (N is a natural number). The number $2^N$ is achieved by "don't care" handling of some bits of one or more lower side of the row address signal.

As described above, the data retention time and the refresh cycle can be longer by holding the same data in plural memory cells. By this, the refresh interval of the self refresh and auto refresh can be increased and the current consumption required for these refresh can be reduced.

The retention time may be changed by varying the number of memory cells for one bit data. Therefore, even though the capacity of the memory cell array can be increased, by increasing the number of word lines (memory cells) as the access unit, power consumption required for the auto refresh and self refresh can be suppressed.

FIG. 6C shows that when the mobile phone enters to the low power consumption mode, the semiconductor device 10 enters to the partial access mode. By this, the semiconductor device 10 limits memories accessed when the mobile phone communicates with the base station to the memory cells for the data holding area. One bit data is held by the plural memory cells.

After the entry into the partial access mode, the semiconductor device 10 repeats periodically entry to and exit from the self refresh mode. The semiconductor device 10 repeats partial access period and self refresh period. The first entry to the self refresh mode may be performed upon completion of the copy operation to be performed at the entry to the partial access mode. During the partial access mode period, the semiconductor device 10 holds one bit data in the plurality of memory cells, so that retention time $t_{REF}$ is longer than that of the related semiconductor device. For example, the retention time $t_{REF}$ during the partial access mode is 512 ms, and the retention time $t_{REF}$ during the self refresh mode is 6.0 s. Upon exit from the self refresh mode, all bank refresh is not performed. As a result, for example, the average power consumption is a 61.4 μA.

When the portable phone exits the low power consumption mode, semiconductor device 10 exits from the partial access mode. At that time, all bank refresh is performed for all the memory cell arrays 18. At this time, if there is being in the self refresh mode, the phone exits from the partial access mode after exiting from the self refresh mode. In this way, all bank refresh can be eliminated by performing all bank refresh when the phone exits from the partial access mode.

Figure 6D:
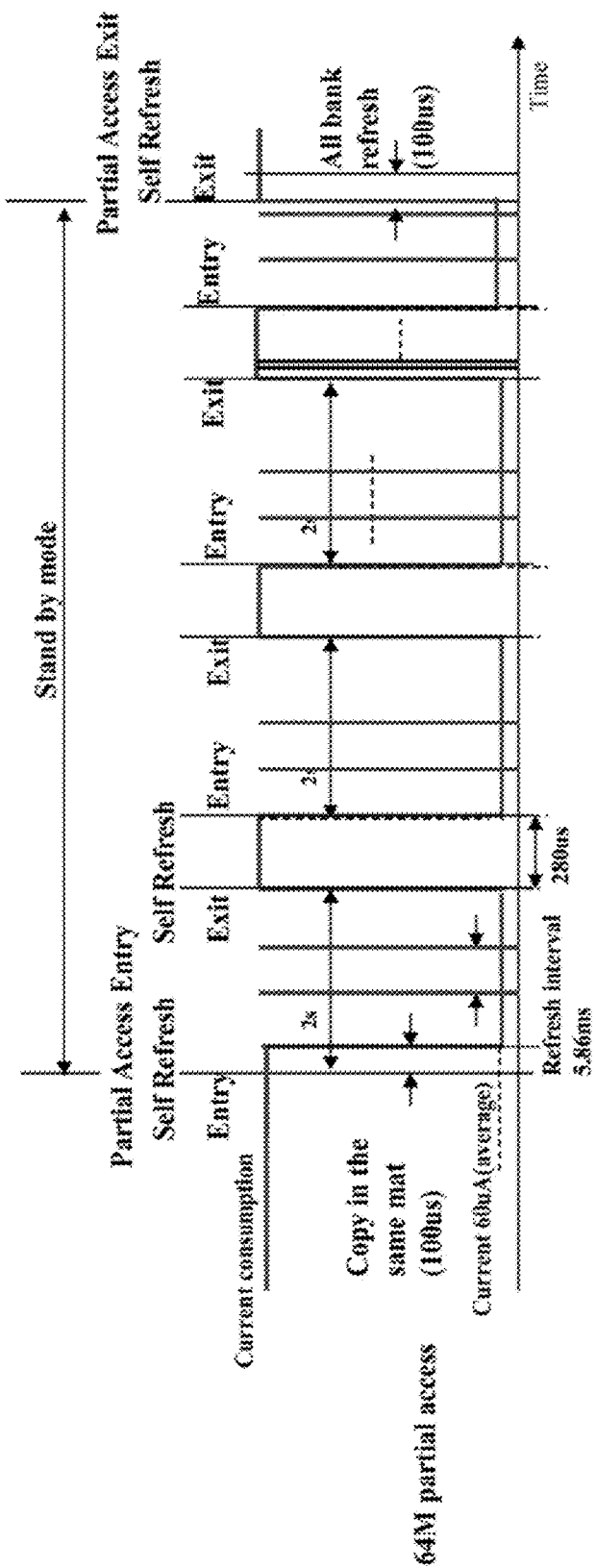
FIG. 6D shows a time variation of the power consumption in the low power consumption mode in accordance with some embodiments of the present disclosure.

FIG. 6D shows a time variation of the power consumption in the low power consumption mode. It is assumed that the mobile phone communicates with the base station, by communication access period 280 μs and communication cycle 2.0 s.

The semiconductor device 10 performs the 64M bit partial access, the retention time $t_{REF}$ in self refresh mode at the time is 6.0 s, and the refresh number (equal to the target word line number) is 1 Kref. Therefore, the refresh operation interval may be 6.0 s/1K=6.0 ms or less. In this case, 5.86 ms is used for the refresh operation interval. The retention time $t_{REF}$ in the partial access time is 512 ms, and refresh times as necessary in the meantime is a 1 Kref same. Therefore, the refresh operation interval may be any 512 ms/1K=512 μs or less. Here, a period in which communication with the base station is performed is 280 μs. Since the period is shorter than the refresh operation interval, no refresh (interrupt) is needed.

Power consumption may be increased in copying in the entry to the partial access mode and all bank refresh in exiting from the partial access mode. However, compared with the effect of reducing the power consumption of partial access mode, such increase can be negligible compared with the power consumption effect by the partial access mode.

Figures 6E, 6F:
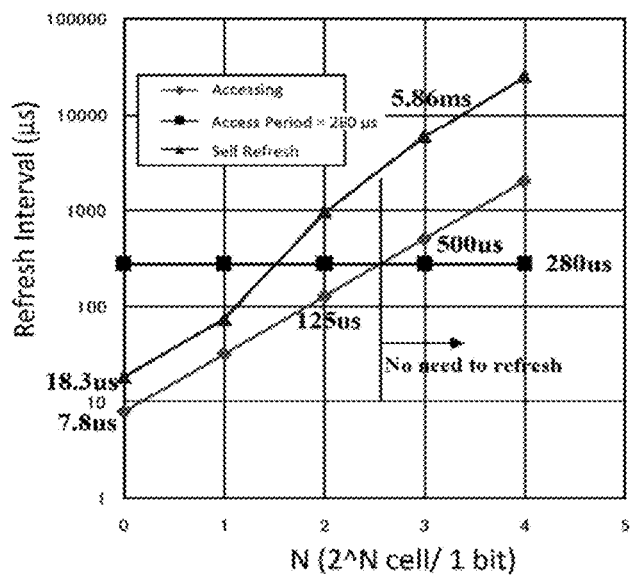
FIG. 6E shows an example of the relationship between the refresh operation interval and the number of memory cells for one bit data in accordance with some embodiments of the present disclosure.
FIG. 6F shows an example of the relationship between the standby current and the storage capacity of the holding area in accordance with some embodiments of the present disclosure.

FIG. 6E shows an example of the relationship between the refresh operation interval and the number of memory cells for one bit data (index N means that one bit data is held by 2N memory cells). It is assumed that refresh operation interval=refresh cycle/access number of words=$t_{REF}$/(8K/2N). In the case that the access period is 280 μs, when the N>=3, access period<refresh operation interval, resulting in that refresh operation is unnecessary. In self refresh period, self refresh period is longer than the refresh period access period.

FIG. 6F shows an example of the relationship between the standby current and the storage capacity of the holding area (access capacity). It is possible that the smaller the storage capacity of the holding area is, the longer the refresh period ($t_{REF}$) can be, resulting in reducing the refresh current consumption. As a result, the smaller the storage capacity of the holding area is, standby current can be also reduced.

FIG. 6G shows a relationship between a standby current and storage capacity of the data holding area (access capacity) of FIG. 6F as the standby current and the number of memory cells of one bit per (index N). As can be seen, when N>=3, the refresh current is negligibly small relative to the steady-state current (DC current).

Referring now to FIG. 7, the data set for the partial access mode is stored in the mode register 14. The control circuit 13 controls each unit of the semiconductor device 10 and implements the operation of the partial access mode based on the stored data set.

The data set for the partial access mode defines the copy area and the data holding area. The copy area and the data holding area are set by storing (changing) the data set for the partial access mode in the mode register 14.

As shown in this figure, the data set is defined such that the data holding area can be selectable by a volume unit. In particular, the data holding area can be selected from among all the banks (256M), 128M, 64M, 32M and 16M bit. Such selection can be implemented using signals XA0 (X0), XA1 (X1), XA2 (X2), XA3 (X3) . . . row address.

The copy area is set so that the memory cells in the copy area are used for retaining the data held by memory cells in the data holding area. Where the data holding area is set $\frac{1}{2}^N$ for all banks, the number of memory cells holding the same data is $2^N$, that is, one memory cell in the holding area and $2^{N-1}$ memory cells in the copy region. By this, the data retention time (retention time) $t_{REF}$ can be increased while the storage capacity of the holding area is decreased. The example in this figure shows 8 Kref, 4 Kref, 2 Kref, 1 Kref, 512 ref. By this, the refresh interval of the refresh operation is 4 times when the storage area becomes a half, and 16 times when the storage area becomes ¼. Thus, it is possible to reduce its power consumption by lengthening the refresh interval operation, and reducing the number of refresh operations.

PAM Specification

FIG. 6A shows the block diagram for the PAM according to some embodiments, and directly explains the elimination of Problem 1 and Problem 2 discussed for PASR previously. The PAM enables a reduction in the refresh operation frequency by two effects: $t_{ret}$ extension and reduction in the memory capacity. This is summarized in FIG. 7 as the PAM specification. Conversion from 1 cell/bit to $2^N$ cells/bit expands $t_{ret}$ to $2^N \times 64$ ms at least. The total number of refresh operations to restore all memory cells is 8-K/$2^N$ owing to the reduction in the memory capacity to 256-M/$2^N$. This dual effect changes the refresh operation interval $t_{REF}$ from 7.8 μs to $2^N \times 2^N \times 7.8$ μs. $t_{ret}$ of $2^N$ cells/bit is analyzed using the measured data presented previously and it is shown that $t_{ret}$ can be one order of magnitude greater than $2^N \times 64$ ms. Here, it can be stated that $t_{ref}$ can be set to $2^N \times 64$ ms.

PAM Circuit Implementation

FIG. 8A shows a conventional 256-Mb DRAM has X decoding circuits that select one WL from X addresses <X0T-X12T>. The X decoding circuits produce RX signals RX0T-511T and FX signals based on X address signals X0T-12T.

Figure 8B:
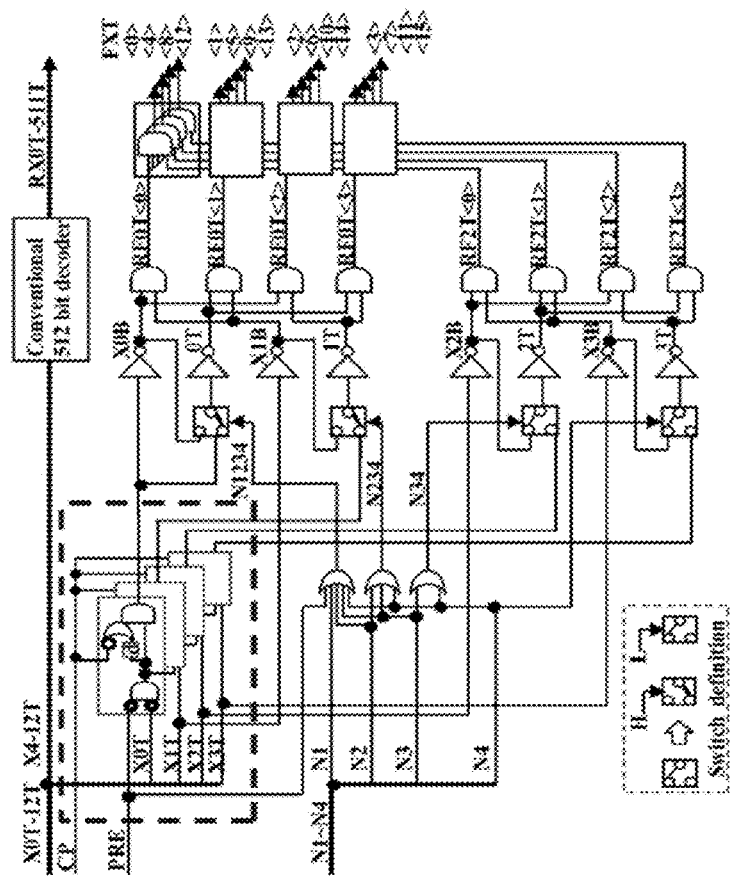
FIG. 8B shows a partial access X-decoder in accordance with some embodiments of the present disclosure.

FIG. 8B shows an exemplary circuit to implement simultaneous selection of $2^N$ WLs. Two 4-bit decoders in FIG. 8A are modified to realize 2N cells/bit (N=1, 2, 3, 4) access mode. One 4-bit decoder selects one output signal of RF0T<0-3> from two X addresses <X0T, X1T>. The other 4-bit decoder selects one output of RF2T<0-3> from two X addresses <X2T, X3T>. The code flag N1 is prepared for 2 WL selections, RF0T<0,1>, which is enabled by simultaneous choice of X0T and X0B. In the same way, N2 is prepared for 4 WL selections, RF0T<0-3>, enabled by simultaneous choice of two pairs, X0T/B and X1T/B. N3 is prepared for 8 WL selections, RF0T<0-3> and RF2T<0,1>, by three pairs X0T/B, X1T/B, and X2T/B. N4 is prepared for 16 WL selections, RF0T<0-3> and RF2T<0-3>, by four pairs X0T/B, X1T/B, X2T/B, and X3T/B.

A delay circuit with copy flag CP in FIG. 8B implements the copy operation of partial access conversion in FIGS. 5A and 5B. This circuit enables delayed selection of X0B for NI, which sets the copy operation from one cell to another. The address specification X0T=L in NI (2 cells/bit mode) forms a delayed selection X0B from X0T.

In the same way, the address specification (X address signals) X0T=X1T=L in N2 (4 cells/bit mode) forms a delayed selection X0B and X1T/B from X0T. X0T=X1T=X2T=L in N3 forms a delayed selection, X0B, X1T/B, and X2T/B. X0T=X1T=X2T=X3T=L in N4 forms a delayed selection, X0B, X1T/B, X2T/B, and X3T/B.

The circuit shown in FIG. 8B can perform Partial Access Copy operation for N=2 (4 cells/bit). The operation includes pre-charging, multi selection and copy operation.

Figure 9A:
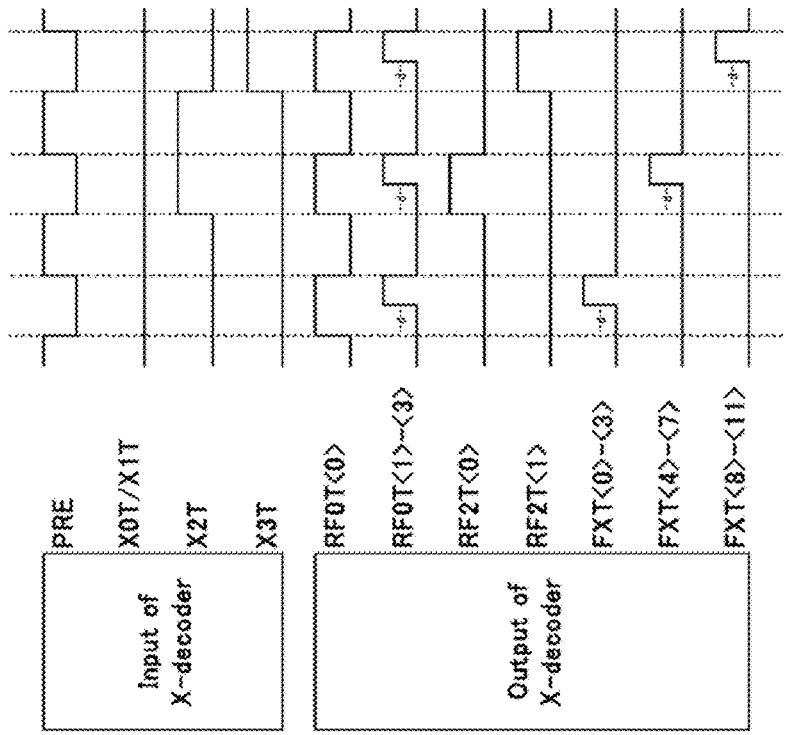
FIG. 9A shows partial access waveforms in accordance with some embodiments of the present disclosure.

FIG. 9A shows the waveforms of the PAM X-decoder when N2=H. Referring to FIG. 8B, Multi select decoder for two outputs (N1=H), selects no output in case of X0T=H. PRE=H realizes the pre-charging operation in the same way with N1=X0T=H.

Figure 8C:
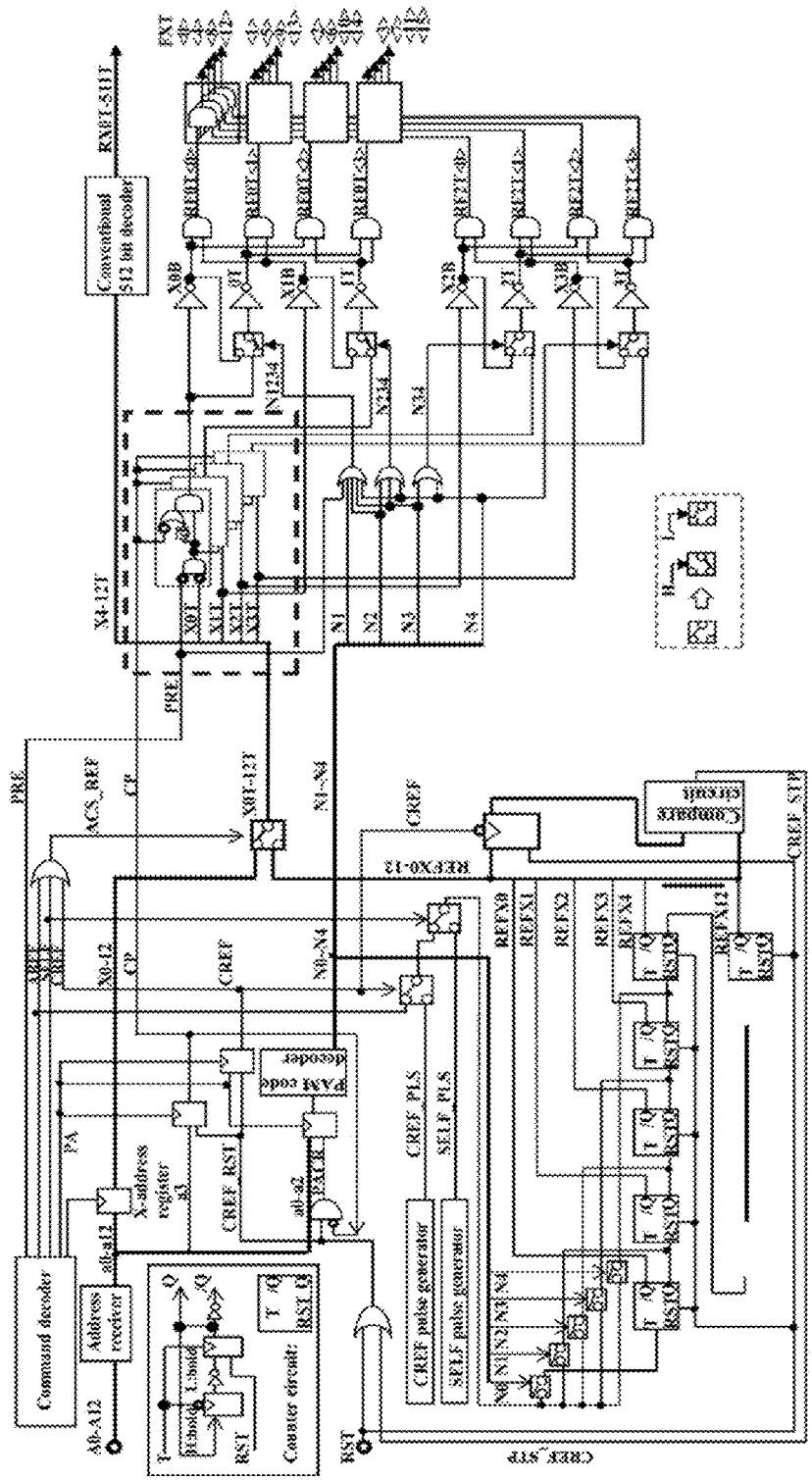
FIG. 8C shows a partial access configuration circuit modification in accordance with some embodiments of the present disclosure.
Figure 9B:
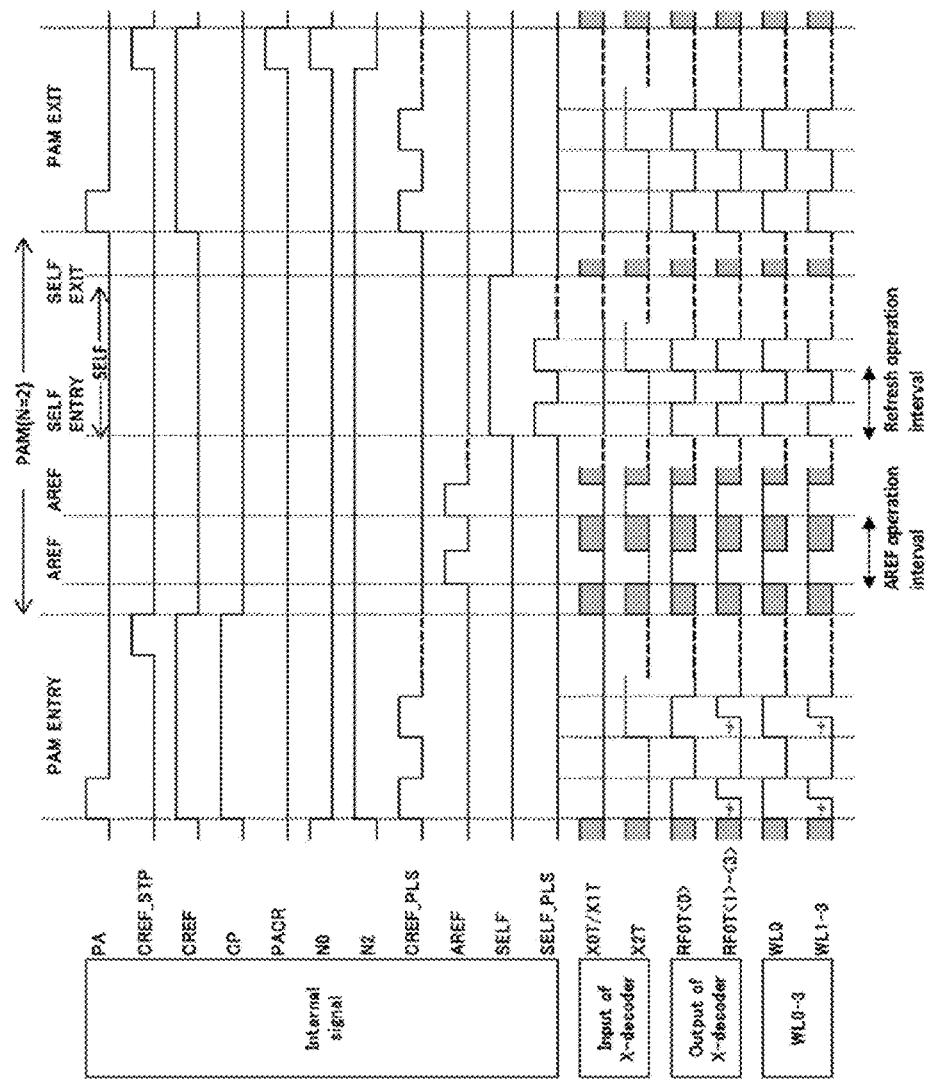
FIG. 9B shows functional waveforms of a partial access configuration in accordance with some embodiments of the present disclosure.

FIG. 8C shows an exemplary conventional DRAM with modifications to enable PAM. The left panel of FIG. 8C is refresh control including the modification for PAM ENTRY and PAM EXIT. When the DRAM receives PAM ENTHY, command decoder generates PA, a one shot pulse, which enables receipt of a PAM code. A0-A2 for PAM code enters PAM code decoder, which outputs N0-N4 signals to keep composed cell number n until the DRAM receives the next PAM EXIT command. PAM code decoder outputs CREF=H and CP=H (set by A3) those decide the continuous copies operation. CREF=H selects CREF_PLS as input signal into refresh counter, which sends the pulses for a continuous copies operation in 100 ns interval repeatedly until compare circuit outputs CREF_STP=H which stops continuous copies at the point of the full array copy completion. The reset operation changes CREF to L and CP to L. FIG. 9B shows these signal transitions. In PAM ENTRY operation N0-N4 signal selects the lowest bit of refresh counter among X0T-X4T.

In PAM, AREF command interval is defined in FIG. 7 and the refresh operation interval in SELF is determined by measured $t_{ret}$ data in wafer condition which is estimated in the following discussion. In both cases output signals REFX0-12 in FIG. 8C enables refresh operation selected by ACS REF as X0T-12T. If PAM is selected, for example, when a mobile phone system is in a call waiting state, both refresh operation intervals of normal and SELF can be extended.

When the DRAM receives PAM EXIT, the circuit operation about CREF is same. But PAM code decoder keeps CP to L by A3. The A0-A2 code in PAM code decoder is reset at the point of the continuous refreshes completion by the signal, CREF_STP=PACR=H. PACR=H selects NO through PAM code decoder.

CP and N1-N4 become input signals of X-decoder circuit, two 4-bit decoders for X0T/X1T and X2T/X3T in the right panel of FIG. 8C. This circuit enables delayed n-1 word-lines selections in case of CP=H, PAM ENTRY in FIG. 5B, and n simultaneous selection in case of CP=L, PAM EXIT in FIG. 5B. N1-N4 decide composed cell number n and CP decides whether operations become continuous copies or continuous refreshes. The address specification X0T=X1T=L in case of N2 (4 cells/bit mode) makes a delay of a few nanoseconds of X0L=X01L=L to the next inverters. This operation generates the delayed selections of RF0T<1-3> from RF0T<0>, which correspond to the delayed selections of WL<1-3> from WL<0>, for RF0T<0-3> and RF2T<0-3> are input signals of the 16-bit decoder for 16 WLs.

As described above, by setting the copy region and the holding region, restricting accessible region into the data holding area, and copying data of memory cells in the data holding area to the memory cells in the copy region, it is possible to expand the refresh interval, reduce the number of refresh operations, and reduce power consumption consumed by auto refresh as well as self refresh.

The refresh interval can be changed by changing the number of memory cells holding the same one bit data. Therefore, by increasing the number of memory cells holding the same one bit data, it is possible to eliminate interruption for auto refresh in short (small data) communication. Further, by performing all bank refresh in exit from the partial access mode and by not performing all bank refresh in exiting from the self refresh, it is possible to reduce more power consumption. Any specific circuit is not needed to avoid all bank refresh in exiting from the self refresh. Further, even if the memory capacity is larger, it can suppress the increase in power consumption by increasing the number of word line as access unit.

Effect of Improvement: Half Pre-charge CMOS Sense Amplifier

A CMOS sense amplifier in a DRAM is a circuit that is used to amplify the signal, $\Delta V$, the difference between the voltage on the BLB and BLT. One voltage is connected to the cell capacitor, and the other is connected to the reference voltage. The operation of sense amplifiers was expressed previously with reference to FIGS. 2C and 2D. In a sense amplifier, the pre-charge voltage is VARY/2, which enables correct amplification even though sense amplifiers in a DRAM have threshold voltage variation, which form a normal distribution.

Figure 10A:
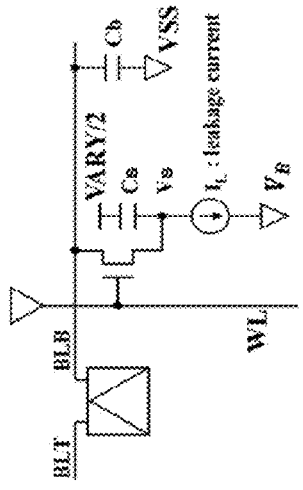
FIG. 10A shows a cell circuit in accordance with some embodiments of the present disclosure.

The signal amounts of H/L data are given by the charge conservation law in FIG. 10A: $\Delta V=+(VARY/2)\times(C_s/(C_b+C_s))$ for H data, and $\Delta V=-(VARY/2)\times(C_s/(C_b+C_s))$ for L data. This relationship may be referred to as identity 1. In this circumstance, $C_b$ and $C_s$ are the capacitances of the BL and storage capacitor, respectively.

When the pause time is infinite, the memory node voltage $V_S$ converges to the p-well voltage $V_B$ in FIG. 10A. H data is broken when $V_S$ is equal to VARY/2, the pre-charge level for the reference voltage. There is no destruction of L data, because $V_S$ for the L data is always within $V_B<V_S<VSS$ and lower than VARY/2.

Effect of Improvement: Pause Time Dependency of Accumulated Charge (H Data)

The following disclosure examines the pause time dependency for an amount of signal for an ACH pause to estimate $t_{ret}$ and the power consumption for the refresh operation in SELF of the PAM. The preceding disclosure explained that the destruction of the memory node voltage H restored in the DRAM memory cell is caused by the discharge of the storage capacitor via leakage current. Destruction itself means that the BL voltage is amplified to a different side from the written side because of storage charge reduction.

The leakage current is represented by a current source $I_L$ that has strong dependence on the voltage difference, $V_S-V_B$ for the pn-junction's leakage, $V_S-VSS$ for GIDL and $V_S-VARY/2$ for sub-threshold current. Generally, the dependence is strong when the voltage difference is small. It can be approximated that h is constant in the region $VARY>=V_S>=VARY/2$, where the storage charge is destroyed from H. This approximation is not appropriate for the sub-threshold current but acceptable for pn-junction's leakage and GIDL.

Figure 10B:
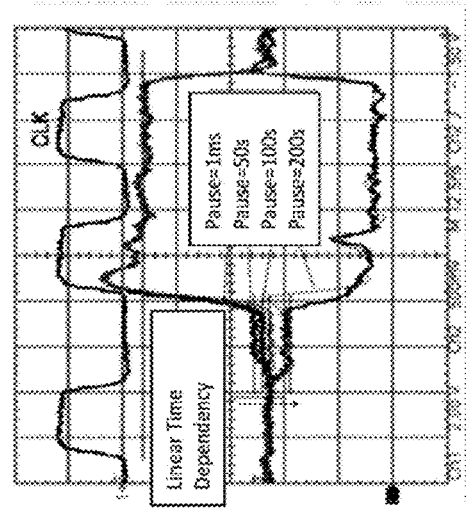
FIG. 10B shows a graph of the measured waveforms in accordance with some embodiments of the present disclosure.
Figure 10C:
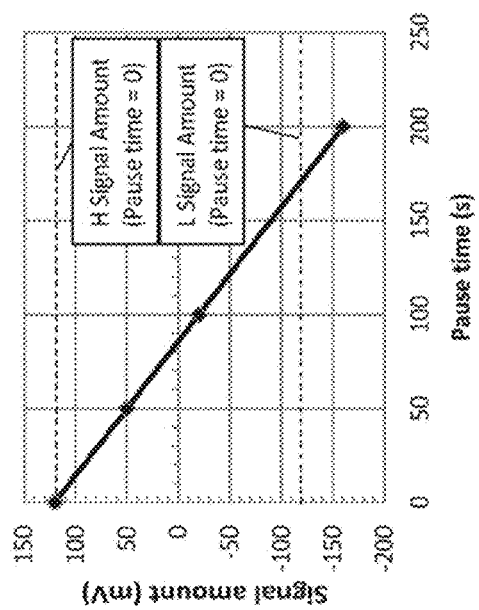
FIG. 10C shows a graph of the measured signal amount in accordance with some embodiments of the present disclosure.

FIGS. 10B and 10C show how the signal amount depends on the pause time for the measurement of a 256-Mb DRAM. These data show that the signal amount decreases approximately in proportion to the pause time t for an ACH pause, indicating that $I_L$ is nearly constant. It can be assumed for simplicity that the retention time is given by the time when the signal amount is zero, i.e. $\Delta V(t_{ret})=0$. In this simple approximation, the amount of signal $\Delta V(t)$ is given by: $\Delta V(t)=(VARY/2)\times(C_s/(C_b+C_s))\times(1-t/t_{ret})$. This relationship may be referred to as identity 2. This means that the storage charge Q(t) is given by: $Q(t)=(VARY/2)\times C_s\times(1-t/t_{ret})$, for $t<=2.3\times t_{ret}$. This relationship may be referred to as identity 3. From the viewpoint of Q(t), FIGS. 10(B) and 10(C) show that Q(t) decreases in proportion to the pause time from $VARY\times(C_s/2)$ at t=0 to $-VARY\times(C_s/2)$ at $t=2t_{ret}$. For $t>2.3t_{ret}$, Q(t) is constant at $-(1.3\times VARY\times C_s)/2$ because the memory node voltage has settled to the lowest voltage $V_B$.

Figure 13A:
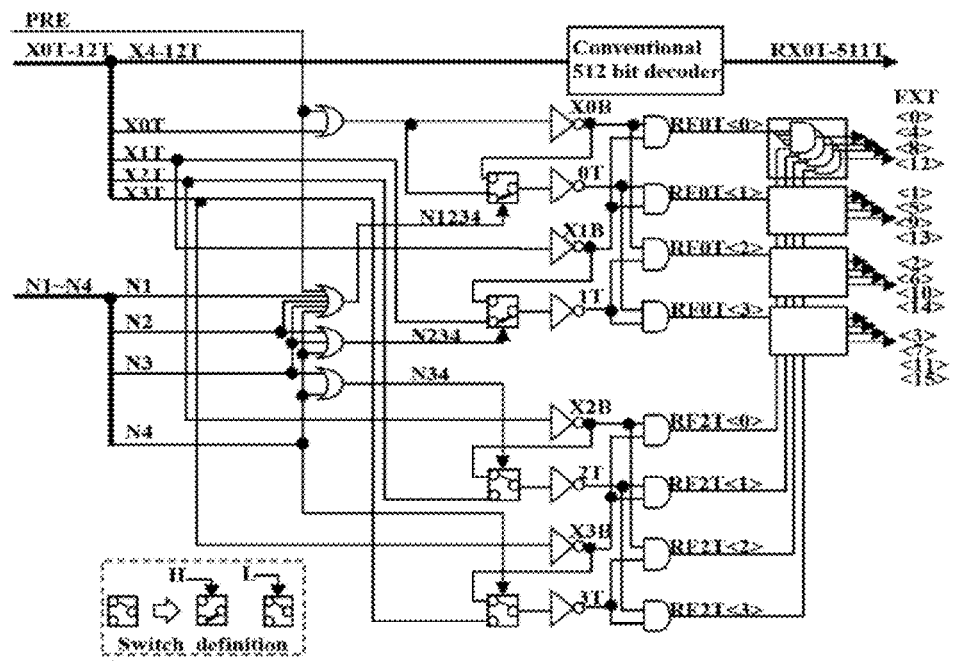
FIG. 13A shows a delay circuit with copy flag implementing the copy operation of PAC in accordance with some embodiments of the present disclosure.
Figure 13B:
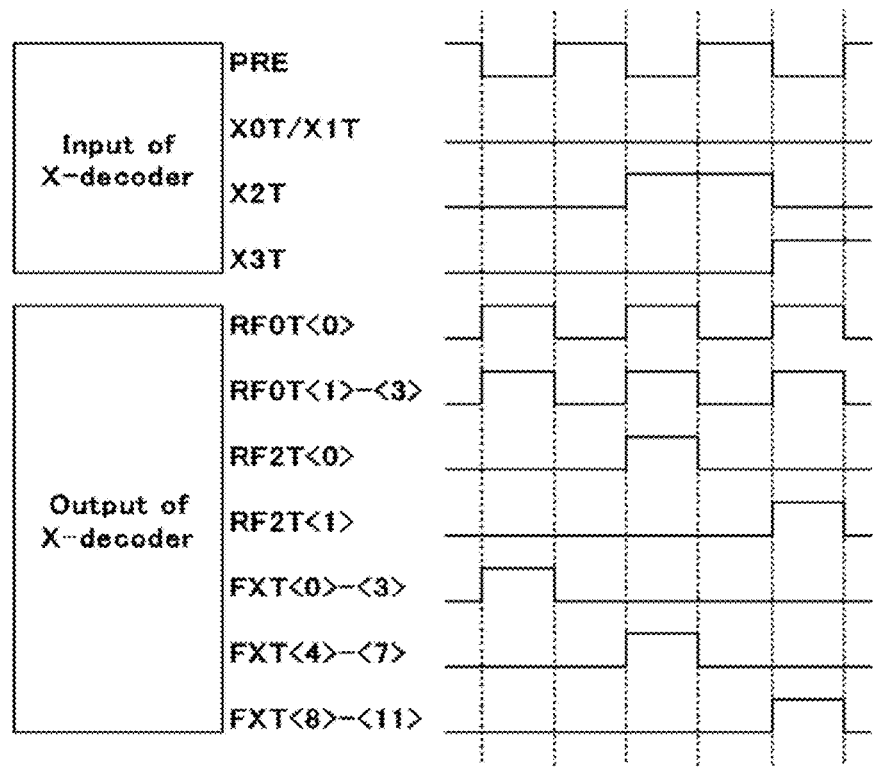
FIG. 13B shows waveforms indicating an operation of the delay circuit in FIG. 13A in accordance with some embodiments of the present disclosure.

FIG. 13A shows a delay circuit with copy flag CP, which implements the copy operation. This circuit enables delayed selection of X0B for N1, which sets the copy operation from one cell to another. The address specification X0T=L in N1 (2 cells/bit mode) forms a delayed selection X0B from X0T. In the same way, the address specifications in N2, N3, and N4 form their delayed selections.

N2=H (4 cells/bit) sets N1234=N234=H. PRE transition to L makes a delay of a few nanoseconds of X0L=X01L=X012L=L to the next inverters when addresses are specified: <X0T, X1T>=<0, 0>. This makes the delayed selections of RF0T<1-3> from RF0T<0>, which correspond to the delayed selections of WL<1-3> from WL<0>. This operation is expressed where <X2T, X3T> is periodically incremented: <X2T, X3T>=<0, 0>, <1, 0>, <0, 1>.

Effect of Improvement: Data Retention Time for 2, 4, 8, and 16 Cells/Bit

Figure 11A:
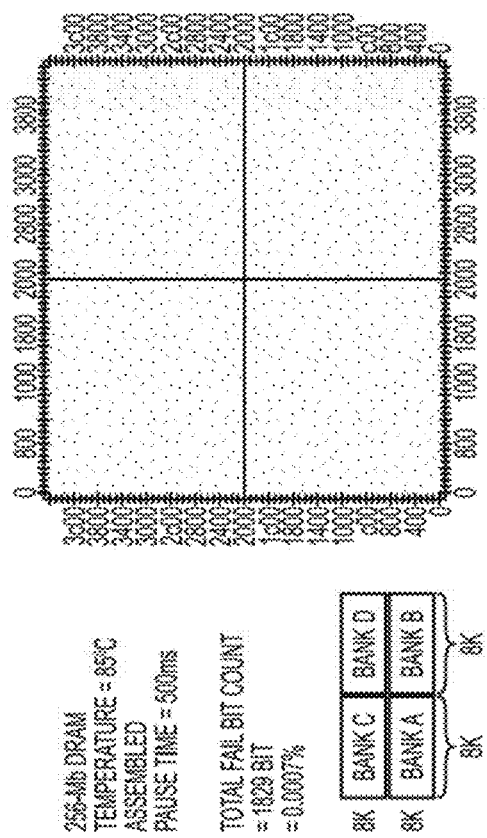
FIG. 11A shows a fail bit map in accordance with some embodiments of the present disclosure.
Figure 11B:
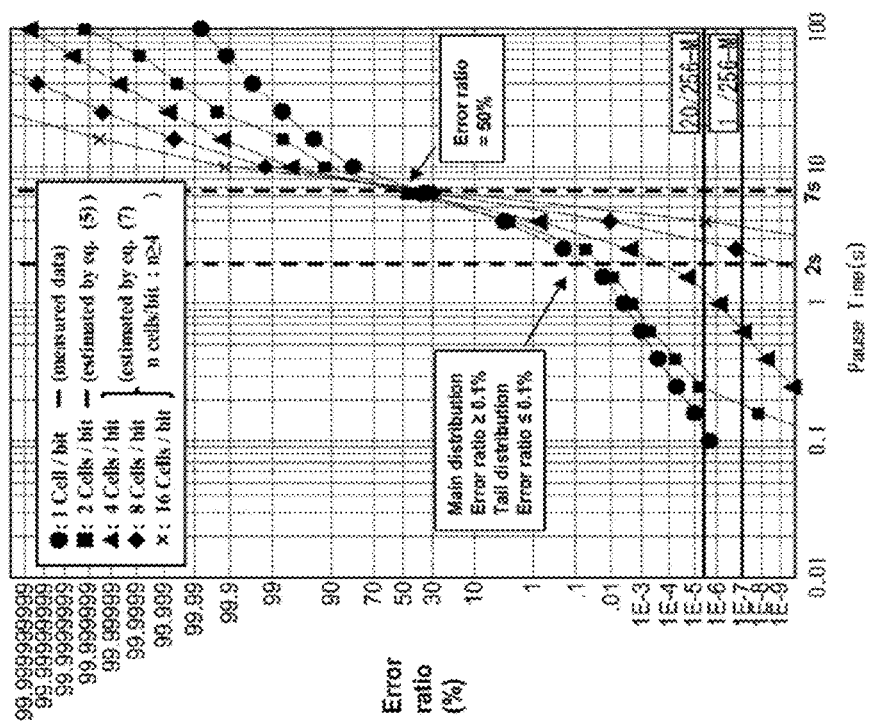
FIG. 11B shows a graph of error ratio in accordance with some embodiments of the present disclosure.

The following analysis leads the data retention time of the composed memory cell from identity 3, the cumulative distribution of 1 cell/bit measured error ratio in FIG. 11B, and the measured random fail-bit map in FIG. 11A. The amount of signal for the case of $2^N$ cells/bit (N>=1) can be obtained by the charge conservation law written with identity 3's Q(t) as in identity 1: This is given as follows: $\Delta V(j_1, \ldots, j_n, t) = (1/(C_b + n \times C_s)) \times \text{SUM}(i=1 \ldots n) \, Q(j_i, t)$. This relationship may be referred to as identity 4. In this case, n is the composed cell number ($n = 2^N$), and j is one combination of n memory cells. When $\Delta V(j_1, \ldots, j_n, t) > 0$, the composed cell j is judged as pass. When $\Delta V(j_1, \ldots, j_n, t) <= 0$, the composed cell j is judged as fail.

The expected value of the fail-bit count of 256/n-Mb DRAM is expressed by the following identity 5, where t is the pause time, θ is the function defined by the following identity 6, and $p_{j1}, \ldots, p_{jn}$ are the probabilities that each cell has a certain pause time. Identity 5 is: $E^{(n)}(t) = (256M/n) \times \text{SUM}(j1) \ldots \text{SUM}(jn) \, \theta(j_1, \ldots, j_n, t) \, p_{j1}, \ldots, p_{jn}$. Identity 6 is: $\theta(j_1, \ldots, j_n, t) = 1$ for $V(j_1, \ldots, j_n, t) <= 0$, and $\theta(j_1, \ldots, j_n, t) = 0$ for $V(j_1, \ldots, j_n, t) > 0$.

For the case of N=1 (2 cells/bit), the expected value $E^{(n)}(t)$ is calculated by identity 5 from the probabilities $p_{tret1}$, $P_{tret2}$ from $\Delta N_{fail}(t_{ret})/256M$. $\Delta N_{fail}(t_{ret})$ is the difference $t_{ret}$ is between two values side-by-side in the measured 1 cell/bit distribution of FIG. 11B when $t_{ret}$ is the center pause time.

For $2^N$ cells/bit (N>=2), the number of calculations is enormous. Here will be used an approximation, the majority decision rule, that a composed cell with $2^N$ cells/bit fails if half the memory cells in $2^N$ cells fail, based on the mechanism of data loss. This approximation means that the memory node voltage of each cell takes either H or L and each cell charge compensates for the charges of the other memory cells. Another assumption is the random formation of the fail-bit distribution. This is the same as in the case of 2 cells/bit. These two assumptions yield the expected value of the fail-bit count of composed cells. The case of composed cells with $2^N$ cells/bit will be discussed using the following notation: n is the number of cells in a composed cell, q is the number of fail cells in a composed cell, and r is the number of fails in 256-Mb memory cells.

The number of combinations needed to select q failed cells in n cells in a composed cell is given by $_nC_q$. The number of combination to select r-q failed cells in the other 256M-n cells is given by $_{256M-n}C_{r-q}$. Thus, the total number of combinations is given by $_nC_q \times _{256M-n}C_{r-q}$. However, the number of combinations to select r failed cells in 256M cells is given by $_{256M}C_r$. Thus, the probability for the above condition is given by $(_nC_q \times _{256M-n}C_{r-q})_{256M}C_r$. By the majority decision rule, failure of composed cell occurs when q>=n/2. Therefore, the expected value of fail bits of the composed cell is given by: $(256M/n) \times \text{SUM}(q=n/2 \text{ to } n) \, ((_nC_q \times _{256M-n}C_{r-q}) \, (_{256M}C_r)$ for (N>=2). This expression can be referred to as identity 7. Error ratios using identity 7 are plotted in FIG. 11B for $t^{(n)}_{ret}$, n=4, 8, and 16. These results show that $t_{ret}$ improves from $t_{ret}$=100 ms (1 cell/bit) to $t_{ret}$=3 s (8 cells/bit). Increasing n reduces the variation in $t_{ret}$ and eliminates the tail distribution. Therefore, the error ratio in FIG. 11B increases steeply with an increase in n when the pause time is 7 s (50% error ratio). Identity 7 for n(>=4) derives the feature. This estimation can be applied to an ACH disturb because the added electric field in the BL direction brings no difference to the data destruction mechanism and random formation of fail bits.

The improvement of retention time must be examined, including the variation of cumulative distribution among DRAM chips. The minimum retention time $t_{ret,min}$ is around 100 ms which is longer than the standardized specification $t_{ref}$ (=64 ms). The process development must achieve this target. The minimum 2 cells/bit retention time is the twice of 1 cell/bit retention time, the compensated result of the $t_{ret,min}$ memory cell which is expressed in identity 4 and FIG. 11B. The tail distribution slopes in N>=2 are steeper than that of N=1. The retention time improvement of FIG. 11B is ensured in spite of the process variation across the DRAM chip.

Effect of Improvement: Current Consumption

Figure 12B:
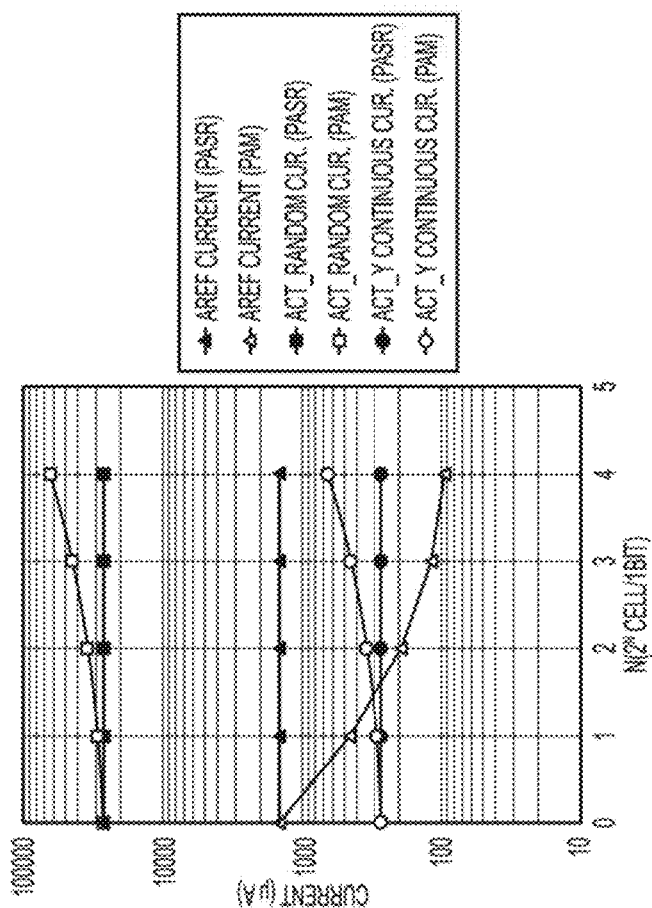
FIG. 12B shows a comparison of current between PASR and PAM in normal operation in accordance with some embodiments of the present disclosure.
Figure 12A:
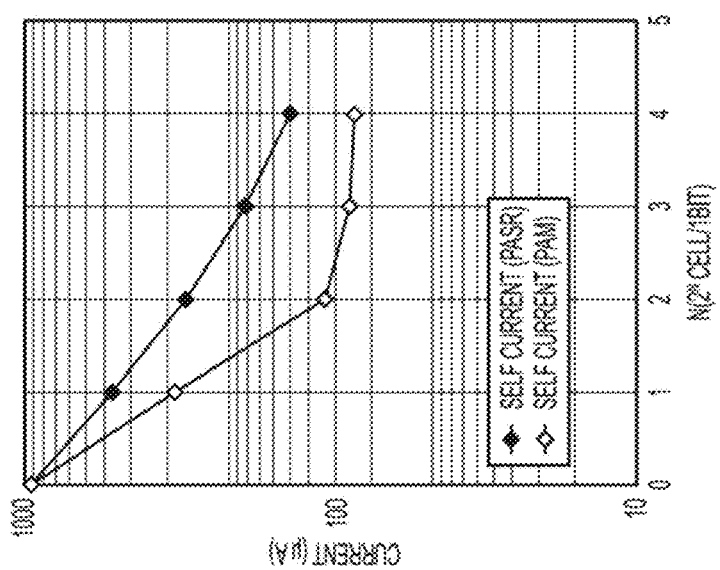
FIG. 12A shows a comparison of current between PASR and PAM in SELF operation in accordance with some embodiments of the present disclosure.

The following disclosure discusses the current consumption of the SELF and normal operation modes. In the SELF mode, the current for the refresh operation and the DC current comprise the total current consumption. In this case, the DC current is the sum of the OFF current of all transistors, operating current for the internal voltage generator, and current for the refresh period oscillator circuit. The measured DC current of the 256-Mb DRAM is around 81 µA. FIG. 12A shows the SELF current comparison of the PAM and PASR. The conventional method PASR always consumes two types of currents in the SELF mode: a refresh operation current of 880 µA derived in identity 8 from an extended $t_{ref}$=12.2 µA and a DC current of 81 µA. PASR reduces the refresh operation current from 880 µA to 880 µA/$2^N$. This can be attributed to the reduction in the preserved density. This gives identity 8 as: $I_{SELF(PASR)}[\mu A] = (880/2^N) + 81$.

In contrast, the PAM reduces the refresh operation frequency by a factor of $2^N \times 2^N$. The load of one refresh operation for n cells/bit has two increasing factors: the additional n−1 storage capacitors connected to each BL and the additional n−1 WLs to drive at once. These two effects are estimated in the following disclosure.

Storage capacitance effect: the storage capacitance $C_s$ is 32 fF from the measured data, and VARY is 1.8 V. The average number of driven capacitors is 8-K×4 banks×½=16-K. The total current charging all storage capacitors for $t_{ref}$=7.8 µs is 32 [fF]×1.8 [V]×16-K/7.8 [µs]=121 µA.

Effect of driven WLs: the WL capacitance is 136.5 fF per WL from the design parameters. The number of driven WLs is 16 WLs per 1 bank. X-decoder must drive the signal to select SWD (called main word line), which has 1053 fF per 1 bank. VPP is 3.6 V and generated from VDD=2.5 V at ⅓ efficiency. The total current for driving all WLs at once for $t_{ref}$=7.8 µs is (136.5×16+1053) [fF]×4 banks×3.6 [V]×3/7.8 [µs]=18 µA.

The n cells/bit refresh operation current is estimated by summation of the measured refresh current adjusted by $t_{REF}$, n−1 times the charging current to cells, and n−1 times the driving current to WLs. This gives identity 9 as: $I_{SELF(PAM)}[\mu A] = (1238+139 \times n) \times (7.8/t_{REF}[\mu s]) + 81$. Partial access conversion from 1 cell/bit to 4 cells/bit changes the current consumption to 100 µA, which is almost equal to the DC current; however 1-bank-PASR (64-Mb PASR) consumer 300 µA of current in the SELF mode. These value are expressed in FIG. 12A.

The present disclosure now discusses the normal operation current, which can be classified into SA activation with X-address selection, data transfer for READ or WRITE operation, AREF operation, and a DC current. Their time-averaged values can be defined as $I_{ACT}$, $I_{DATA}$, and $I_{AREF}$, which depend on the operation frequency. The DC current of 81 µA is the same as that in the SELF mode. The common equation for PASR and PAM is expressed by: $I_{normal}[\mu A] = I_{ACT} + I_{DATA} + I_{REF} + 81$. This relationship can be referred to as identity 10.

For PASR, $I_{ACT(PASR)}[\mu A]=(1377/N_{BANK})\times(7.8/t_{ACT[\mu s]})$. For PASR, $I_{AREF(PASR)[\mu A]}=1377\times(7.8/t_{REF[\mu s]})$. For PASR, $t_{REF}=7.8~\mu s$. This collection of relationships can be referred to as identity 11.

For PAM, $I_{ACT(PAM)}[\mu A]=((1238+139\times n)/N_{BANK})\times(7.8/t_{ACT[\mu s]})$. For PAM, $I_{AREF(PAM)}[\mu A]=[1238+139\times n]\times(7.8/t_{REF}[\mu s])$. For PAM, $t_{REF}=7.8~[\mu s]\times 2^N\times 2^N$. This collection of relationships can be referred to as identity 12.

The number of banks, $N_{BANK}$ in identities 11 and 12 is four for a 256-Mb DRAM. One bank is activated, contrary to the AREF operation for all banks Parameter $t_{ACT}$ in identities 11 and 12 depends on the condition of the system. Below is considered the normal operation current for two typical conditions, minimum and maximum $t_{ACT}$ at maximum data transfer rates.

Random Addressing: 256-Mb DRAM is activated repeatedly in a 100 ns interval, and $t_{ACT}$=100 ns. In this case, $t_{ACT}$ is much greater than $I_{AREF}$, and the PAM (N>0) increases the operation current as shown in FIG. 12B.

Continuous Addressing: consider a 100-MHz clock synchronized operation as an example. If a DRAM is accessed continuously in the Y-address direction, each 8-bit data are accessed in a 10-ns interval repeatedly, an 8-K bit page is fully accessed in 10 µs, and $t_{ACT}$=10 µs. In this case, PAM (N>0) can reduce the total current, as shown in FIG. 12B. Moreover, the AREF disturbance frequency decreases by $t_{REF}$=7.8 µs×$2^N$×$2^N$. This means that the interruption frequency is reduced if the PAM (N>0) is used for Y-continuous access. $t_{ACT}$ depends on the data access interval determined by the clock frequency. In 2012, a 1-GHz operation frequency is widely used. A higher frequency shortens $t_{ACT}$ and lowers the current reduction effect by the PAM. There is a transition point in $t_{ACT,tran}$ where the PAM (N>0) can or cannot reduce the current. The transition point for N=1 is 260 ns. For $t_{ACT}$<260 ns, full array access (N=0) is more useful not only from a memory view point but also from the current consumption view point.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The construction and arrangement of the elements as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. The elements and assemblies may be constructed from any of a wide variety of materials that provide sufficient strength or durability, in any of a wide variety of colors, textures, and combinations. Additionally, in the subject description, the word "exemplary" is used to mean serving as an example, instance, or illustration. Any embodiment or design described herein as "exemplary" is not necessarily to be construed as preferred or advantageous over other embodiments or designs. Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

What is claimed is:

1. A device comprising:
   a plurality of memory banks;
   a controller controlling storage of data in cells of the plurality of memory banks;
   a command decoder configured to provide an enable signal responsive to a partial access mode entry command signal;
   a partial access mode code decoder configured to receive the enable signal, to receive a portion of address signals responsive to the enable signal, to convert the portion of the address signals into a plurality of code flag signals, and further configured to provide a copy operation control signal and the plurality of code signals; and
   an address decoder circuit coupled to the controller, the address decoder circuit comprising:
      at least one multi-bit decoding circuit comprising a plurality of switches, the plurality of switches including comprising a switch configured to select a plurality of word lines; and
      a delay circuit configured to receive the portion of address signals and the copy operation control signal, and further configured to provide a delay signal when the copy operation control signal is active,
   wherein the controller copies each bit of data stored in the plurality of memory banks that is to be preserved from 1 cell per bit to a plurality of cells per bit by a copy operation from the 1 cell connected with one word line to the plurality of cells connected with a plurality of respective word lines,
   wherein the switch is configured to receive a corresponding code flag signal of the plurality of code flag signals and further configured to simultaneously select the plurality of word lines responsive to the corresponding code flag signal, and
   wherein the switch is further configured to delay selection of the plurality of word lines responsive to the portion of address signals, further responsive to the corresponding code flag signal and the delay signal.

2. The device of claim 1, wherein the controller copying causes the effective retention time of each bit of data copied to be extended.

3. The device of claim 2, wherein the effective retention time of each bit of data copied is extended by a factor of $2^N$.

4. The device of claim 1, wherein the controller copying causes the power consumption of the memory module to be reduced.

5. The device of claim 4, wherein the controller can reduce the power consumption of the device by copying each bit of data stored in the plurality of memory banks that is to be preserved from 1 cell per bit to $2^N$ cells per bit in both a normal operation mode and a self refresh operation mode.

6. The device of claim 1, wherein N=4.

7. The device of claim 1, wherein a portion of each memory bank of the plurality of memory banks is active when the memory module is in a self refresh mode of operation.

8. The device of claim 1, wherein the portion of address signals represents lower bits of a row address.

9. The device of claim 1, further comprising a refresh counter configured to select one or more bits based on the plurality of code flag signals,
wherein the partial access mode code decoder is further configured to provide a refresh control signal, and
wherein the refresh counter is configured to transmit pulses for instructing continuous copies operation responsive to the refresh control signal, and further configured to provide a stop signal instructing the continuous copies operation to the partial access mode code decoder and the address decoder circuit.

10. A method for managing storage of data in a device, the method comprising:
storing at least one bit of data in at least one cell of the device, wherein each bit of data is stored in a single cell of the device;
reading a portion of the at least one bit of data from a memory cell connected with one word line;
providing an enable signal responsive to a partial access mode entry command signal;
receiving the enable signal;
receiving a portion of address signals responsive to the enable signal;
converting the portion of the address signals into a plurality of code flag signals;
providing a copy operation control signal and the plurality of code flag signals;
receiving the portion of address signals and the copy operation control signal;
providing a delay signal when the received copy operation control signal is active;
receiving a corresponding code flag signal of the plurality of code flag signals by a switch, the corresponding code flag signal corresponds to a plurality of signals of the portion of address signals;
selecting a plurality of word lines coupled to a plurality of cells of the device simultaneously by the switch store the portion of the at least one bit of data;
writing the portion of the at least one bit of data into the plurality of cells,
wherein the selecting the plurality of word lines coupled to the plurality of cells of the device simultaneously to store the portion of the at least one bit of data further comprises:
delaying selection of the plurality of word lines responsive to the portion of address signals, further responsive to the corresponding code flag signal and the delay signal.

11. The method of claim 10, wherein the step of copying causes the effective retention time of each bit of data copied to be extended.

12. The method of claim 11, wherein the effective retention time of each bit of data copied is extended by a factor of $2^N$.

13. The method of claim 10, wherein the step of copying allows the power consumption of the device to be reduced.

14. The method of claim 13, wherein the power consumption of the device can be reduced by the step of copying in both a normal operation mode and a self refresh operation mode.

15. The method of claim 10, wherein N=4.

16. The method of claim 10, wherein the at least one cell of the device is spread across a plurality of memory banks of the memory module, and a portion of each memory bank of the plurality of memory banks is active when the device is in a self refresh mode of operation.

* * * * *

UNITED STATES PATENT AND TRADEMARK OFFICE
CERTIFICATE OF CORRECTION

PATENT NO.        : 9,640,240 B2                                         Page 1 of 1
APPLICATION NO.   : 14/168899
DATED             : May 2, 2017
INVENTOR(S)       : Yoshiro Riho It is certified that error appears in the above-identified patent and that said Letters Patent is hereby corrected as shown below:

In the Claims

|  | Reads | Should Read |
|---|---|---|
| Column 20, Line 22 | "…control signal and the plurality of code signals; and" | --…control signal and the plurality of code flag signals; and-- |
| Column 22, Line 2-3 | "…by the switch store the portion of the at least one bit of data;" | --…by the switch to store the portion of the at least one bit of data; and-- |

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*